United States Patent
Kogura et al.

(10) Patent No.: US 10,287,680 B2
(45) Date of Patent: May 14, 2019

(54) METHOD OF MANUFACTURING SEMICONDUCTOR DEVICE, SUBSTRATE PROCESSING APPARATUS, AND RECORDING MEDIUM

(71) Applicant: HITACHI KOKUSAI ELECTRIC INC., Tokyo (JP)

(72) Inventors: Shintaro Kogura, Toyama (JP); Ryota Sasajima, Toyama (JP); Kosuke Takagi, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 15/925,228

(22) Filed: Mar. 19, 2018

(65) Prior Publication Data
US 2018/0305817 A1 Oct. 25, 2018

Related U.S. Application Data

(63) Continuation of application No. PCT/JP2015/077336, filed on Sep. 28, 2015.

(51) Int. Cl.
*H01L 21/31* (2006.01)
*H01L 21/469* (2006.01)
(Continued)

(52) U.S. Cl.
CPC ...... *C23C 16/45527* (2013.01); *C23C 16/308* (2013.01); *C23C 16/36* (2013.01);
(Continued)

(58) Field of Classification Search
None
See application file for complete search history.

(56) References Cited

U.S. PATENT DOCUMENTS 4,608,943 A * 9/1986 Doehler ............... C23C 16/042
118/50.1
2003/0186560 A1 10/2003 Hasebe et al.
(Continued)

FOREIGN PATENT DOCUMENTS

JP 03-016324 U 2/1991
JP 05-198517 A 8/1993
(Continued)

OTHER PUBLICATIONS

International Search Report dated Dec. 22, 2015 of PCT International Application No. PCT/JP2015/077336.

*Primary Examiner* — Calvin Y Choi
(74) *Attorney, Agent, or Firm* — Volpe and Koenig, P.C.

(57) ABSTRACT

There is provided a technique that includes: forming a film on a substrate in a process chamber by performing: supplying a precursor gas to the substrate through a first nozzle; and supplying at least one selected from a group consisting of an oxygen-containing gas and a nitrogen-and-hydrogen-containing gas to the substrate through a second nozzle that is configured such that gas stagnation on a surface of the second nozzle caused by the second nozzle is less than gas stagnation on a surface of the first nozzle caused by the first nozzle, or such that contact of the second nozzle with gas staying on the surface of the second nozzle is less than contact of the first nozzle with gas staying on the surface of the first nozzle.

16 Claims, 17 Drawing Sheets

(51) Int. Cl.
  *C23C 16/455* (2006.01)
  *C23C 16/30* (2006.01)
  *C23C 16/36* (2006.01)
  *H01L 21/02* (2006.01)

(52) U.S. Cl.
  CPC ........ *C23C 16/455* (2013.01); *H01L 21/0228* (2013.01); *H01L 21/02126* (2013.01); *H01L 21/02211* (2013.01); *H01L 21/31* (2013.01)

(56) References Cited

U.S. PATENT DOCUMENTS

| | | |
|---|---|---|
| 2008/0083372 A1 | 4/2008 | Inoue et al. |
| 2009/0088001 A1 | 4/2009 | Nakagawa |
| 2012/0156886 A1 | 6/2012 | Shirako et al. |
| 2014/0342573 A1 | 11/2014 | Hirose et al. |

FOREIGN PATENT DOCUMENTS

| | | |
|---|---|---|
| JP | 09-025579 A | 1/1997 |
| JP | 2002-075978 A | 3/2002 |
| JP | 2002-324788 A | 11/2002 |
| JP | 2007-027425 A | 2/2007 |
| JP | 2008-041915 A | 2/2008 |
| JP | 2009-088315 A | 4/2009 |
| JP | 2012-146939 A | 8/2012 |
| JP | 2014-063959 A | 4/2014 |
| WO | 2013/027549 A1 | 2/2013 |

\* cited by examiner

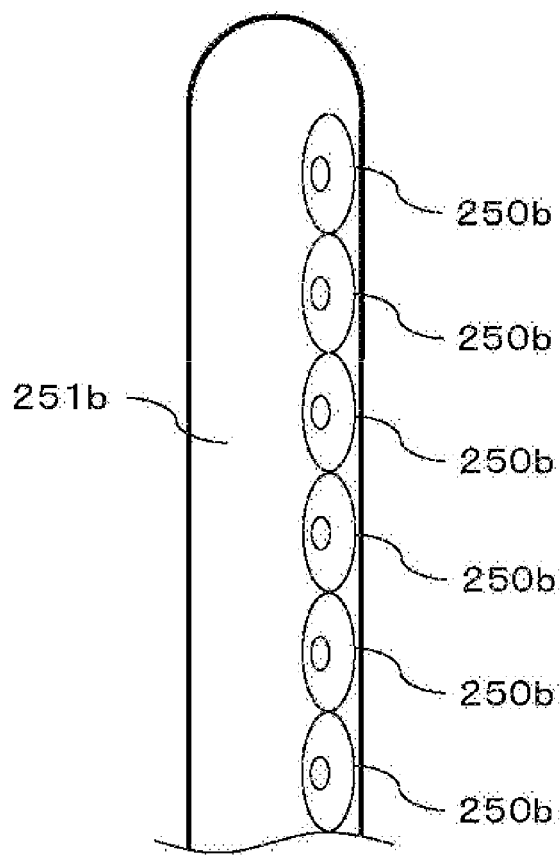

METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

This application is a Bypass Continuation Application of PCT International Application No. PCT/JP2015/077336, filed Sep. 28, 2015, the disclosure of which is incorporated herein in its entirety by reference.

TECHNICAL FIELD

The present disclosure relates to a method of manufacturing a semiconductor device, a substrate processing apparatus, and a recording medium.

BACKGROUND

As one process of manufacturing a semiconductor apparatus (device), a process of forming a film on a substrate may be performed by non-simultaneously supplying a precursor gas, an oxygen (O)-containing gas, and a gas containing nitrogen (N) and hydrogen (H), to the substrate accommodated in a process chamber.

However, inventors have found through keen research that when a gas containing O or a gas containing N and H is supplied into a process chamber, a large amount of particles may be generated in the process chamber.

SUMMARY

Some embodiments of the present disclosure provide a technique capable of suppressing generation of particles when a film is formed on a substrate.

According to one embodiment of the present disclosure, there is provided a technique that includes: forming a film on a substrate in a process chamber by performing: supplying a precursor gas to the substrate through a first nozzle and supplying at least one selected from a group consisting of an oxygen-containing gas and a nitrogen-and-hydrogen-containing gas to the substrate through a second nozzle that is configured such that gas stagnation on a surface of the second nozzle caused by the second nozzle is less than gas stagnation on a surface of the first nozzle caused by the first nozzle, or such that contact of the second nozzle with gas staying on the surface of the second nozzle is less than contact of the first nozzle with gas staying on the surface of the first nozzle.

BRIEF DESCRIPTION OF DRAWINGS

FIG. 7C is a perspective view of a second nozzle in a modification of Configuration Example 1.

DETAILED DESCRIPTION

Figure 1:
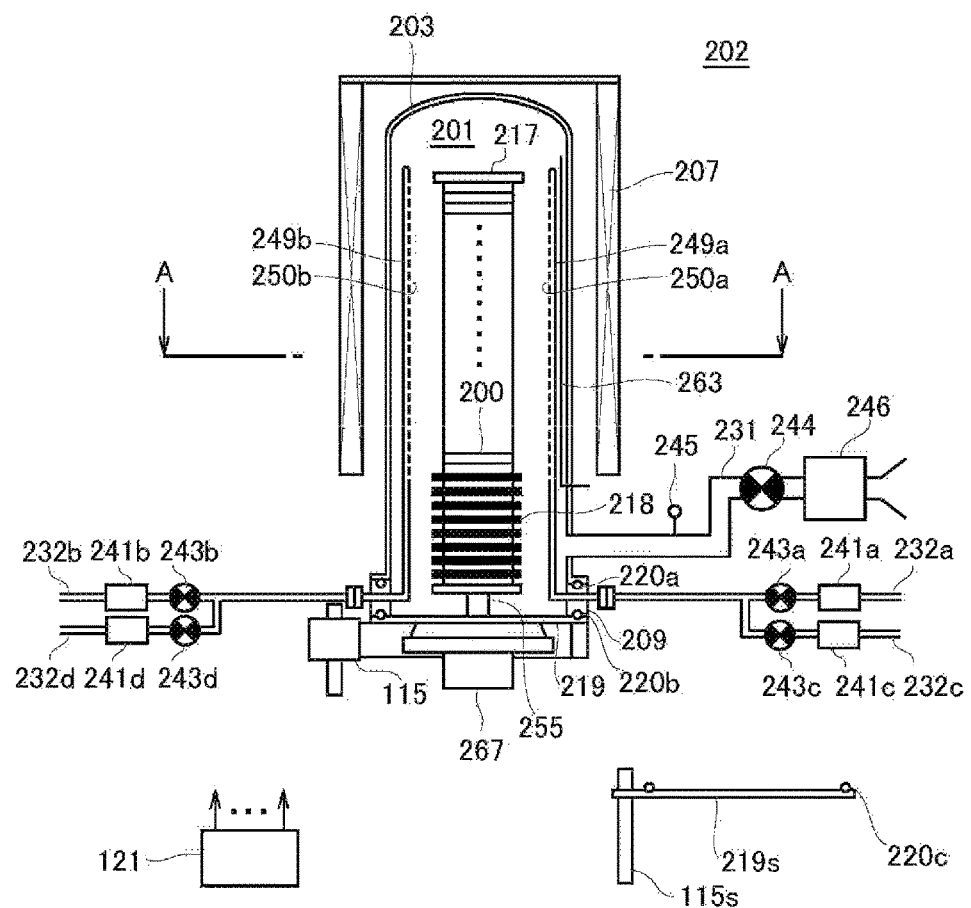
FIG. 1 is a schematic configuration view of a vertical processing furnace of a substrate processing apparatus suitably used in a first embodiment of the present disclosure, in which a portion of the processing furnace is illustrated in a vertical cross section.

Embodiments of the present disclosure will be now described in detail with reference to the drawings. Like or equivalent components, members, and processes illustrated in each drawing are given like reference numerals and a repeated description thereof will be properly omitted. Further, the embodiments are presented by way of example only, and are not intended to limit the present disclosure, and any feature or combination thereof described in the embodiments may not necessarily be essential to the present disclosure.

First Embodiment

A first embodiment of the present disclosure will now be described with reference to FIGS. 1 to 3.

(1) Configuration of Substrate Processing Apparatus

Figure 2:
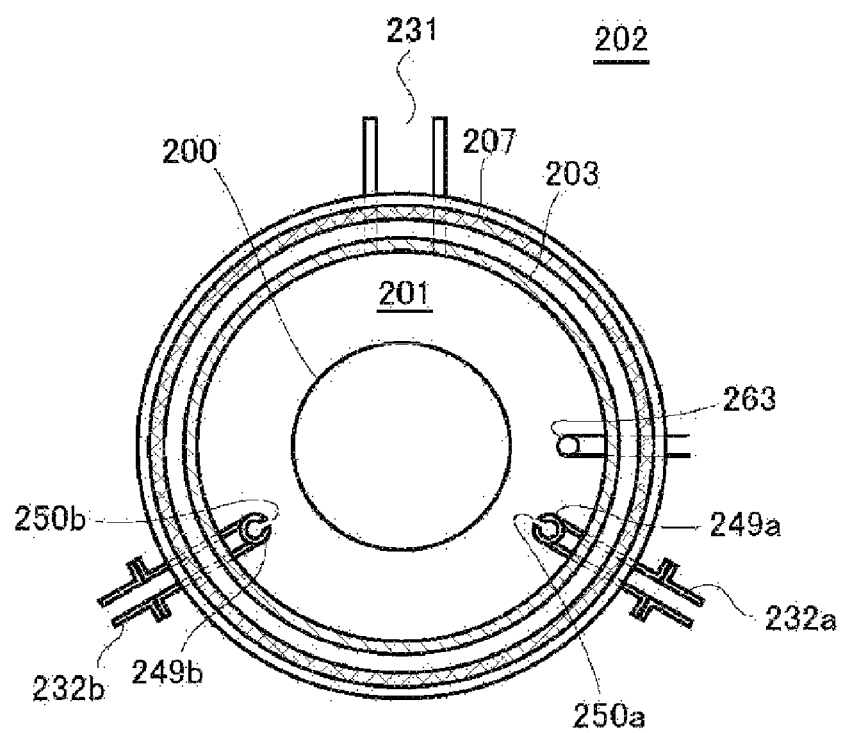
FIG. 2 is a schematic configuration view of the vertical processing furnace of the substrate processing apparatus suitably used in the first embodiment of the present disclosure, in which a portion of the processing furnace is illustrated in a cross section taken along the line A-A in FIG. 1.

As illustrated in FIG. 1, a processing furnace 202 includes a heater 207 as a heating mechanism (temperature adjustment part). The heater 207 has a cylindrical shape and is supported by a heater base (not shown) serving as a support plate so as to be vertically installed. As will be described later, the heater 207 also functions as an activation mechanism (an excitation part) configured to thermally activate (excite) a gas.

A reaction tube 203 is disposed inside the heater 207 to be concentric with the heater 207. The reaction tube 203 is made of a heat resistant material such as quartz ($SiO_2$), silicon carbide (SiC) or the like and has a cylindrical shape with its upper end closed and its lower end opened. A manifold (inlet flange) 209 is disposed below the reaction tube 203 to be concentric with the reaction tube 203. The manifold 209 is made of metal such as stainless steel (SUS, Steel Use Stainless), and has a cylindrical shape with its upper and lower ends opened. The upper end of the manifold 209 engages with the lower end of the reaction tube 203. The manifold 209 is configured to support the reaction tube 203. An O-ring 220a as a seal member is installed between the manifold 209 and the reaction tube 203. The manifold 209 is supported by the heater base. Thus, the reaction tube 203 comes into a vertically mounted state. A processing vessel (reaction vessel) mainly includes the reaction tube 203 and the manifold 209. A process chamber 201 is formed in a hollow cylindrical portion of the processing vessel. The process chamber 201 is configured to accommodate a plurality of wafers 200 as substrates, in such a state that the wafers 200 are arranged in a horizontal posture and in multiple stages along a vertical direction by a boat 217 which will be described later.

In the process chamber 201, a nozzle 249a as a first nozzle for supplying a precursor (precursor gas) and a nozzle 249b as a second nozzle for supplying a reactant (reaction gas) are installed to penetrate a side wall of the manifold 209. Gas supply pipes 232a and 232b are connected to the nozzles 249a and 249b, respectively. In this manner, the two nozzles 249a and 249b and the two gas supply pipes 232a and 232b are installed in the processing vessel (the manifold 209) and are capable of supplying a plurality of kinds of gases into the process chamber 201. The nozzle 249b in this embodiment has a unique surface shape different from that of the nozzle 249a. The structure peculiar to this nozzle 249b will be described later.

Mass flow controllers (MFCs) 241a and 241b, which are flow rate controllers (flow rate control part), and valves 243a and 243b, which are opening/closing valves, are installed to the gas supply pipes 232a and 232b, respectively, sequentially from upstream sides of the gas supply pipes 232a and 232b. Gas supply pipes 232c and 232d, which supply inert gas, are connected to the gas supply pipes 232a and 232b on downstream sides of the valves 243a and 243b, respectively. MFCs 241c and 241d, which are flow rate controllers (flow rate control part), and valves 243c and 243d, which are opening/closing valves, are installed to the gas supply pipes 232c and 232d, respectively, sequentially from upstream sides of the gas supply pipes 232c and 232d.

The nozzles 249a and 249b are connected to front end portions of the gas supply pipes 232a and 232b. As illustrated in FIG. 2, each of the nozzles 249a and 249b is disposed in a space with an annular plane-view shape between an inner wall of the reaction tube 203 and the wafers 200 such that the nozzles 249a and 249b extend upward along an arrangement direction of the wafers 200 from a lower portion to an upper portion of the inner wall of the reaction tube 203. Specifically, each of the nozzles 249a and 249b is installed on a lateral side of a wafer arrangement region in which the wafers 200 are arranged, namely in a region which horizontally surrounds the wafer arrangement region, so as to extend along the wafer arrangement region.

That is to say, each of the nozzles 249a and 249b is installed to be perpendicular to surfaces (flat surfaces) of the wafers 200 on a lateral side of end portions (peripheral edge portions) of the wafers 200 which are loaded into the process chamber 201. Each of the nozzles 249a and 249b is configured as an L-shaped long nozzle. Horizontal portions of the nozzles 249a and 249b are installed to penetrate a sidewall of the manifold 209. Vertical portions of the nozzles 249a and 249b are installed to extend upward at least from one end portion toward the other end portion of the wafer arrangement region. Gas supply holes 250a and 250b for supplying gas are installed at side surfaces of the nozzles 249a and 249b, respectively. The gas supply holes 250a and 250b are opened toward a center of the reaction tube 203 and are capable of supplying gas toward the wafers 200. A plurality of gas supply holes 250a and 250b may be formed between the lower portion and the upper portion of the reaction tube 203. Each of the gas supply holes 250a and 250b may have the same (or substantially the same) aperture area and may be formed at the same (or substantially the same) aperture pitch.

As described above, in the present embodiment, gases are transferred through the nozzles 249a and 249b, which are disposed in a vertically-elongated space with an annular plane-view shape, i.e., a cylindrical space, configured by an inner surface of the side wall of the reaction tube 203 and the end portions (peripheral edge portions) of the wafers 200 arranged inside the reaction tube 203. The gases are initially injected into the reaction tube 203, near the wafers 200, through the gas supply holes 250a and 250b formed in the nozzles 249a and 249b. Accordingly, the gases supplied into the reaction tube 203 mainly flow in the reaction tube 203 in a direction parallel to the surfaces of the wafers 200, i.e., in a horizontal direction. With this configuration, the gases may be uniformly supplied to the respective wafers 200. This makes it possible to improve uniformity in the thickness of a film formed on each of the wafers 200. In addition, the gases flowing on the surfaces of the wafers 200 after reaction, i.e., the reacted residual gas, flow toward an exhaust port, i.e., the exhaust pipe 231, which will be described later. The flow direction of the residual gas is not limited to a vertical direction but may be appropriately decided depending on the position of the exhaust port.

A precursor gas, for example, a halosilane precursor gas containing Si as a predetermined element and a halogen element, is supplied from the gas supply pipe 232a into the process chamber 201 via the MFC 241a, the valve 243a and the nozzle 249a.

The precursor gas refers to a gaseous precursor, for example, a gas obtained by vaporizing a precursor which remains in a liquid state under room temperature and atmospheric pressure, or a precursor which remains in a gaseous state under room temperature and atmospheric pressure. The halosilane precursor refers to a silane precursor having a halogen group. Examples of the halogen group may include a chloro group, a fluoro group, a bromo group and an iodine group. That is to say, the halogen group includes a halogen element such as chlorine (Cl), fluorine (F), bromine (Br), iodine (I) or the like. The halosilane precursor may be referred to as a kind of halide. When the term "precursor" is used herein, it may refer to "a precursor staying in a liquid state," "a precursor staying in a gaseous state (precursor gas)," or both of them.

For example, a carbon (C)-free precursor gas containing Si and Cl, i.e., an inorganic chlorosilane precursor gas, may be used as the halosilane precursor gas. For instance, hexachlorodisilane ($Si_2Cl_6$, abbreviation: HCDS) gas, octachlorotrisilane ($Si_3Cl_8$, abbreviation: OCTS) gas or the like may be used as the inorganic chlorosilane precursor gas. It can be said that these gases are precursor gases containing at least two Si atoms in one molecule, further containing Cl atoms and having Si—Si bonds. These gases act as a Si source in a film forming process to be described later.

For example, a precursor gas containing Si, Cl and an alkylene group and having a Si—C bond, i.e., an alkylene chlorosilane precursor gas which is an organic chlorosilane precursor gas, may also be used as the halosilane precursor gas. The alkylene group includes a methylene group, an ethylene group, a propylene group, a butylene group or the like. The alkylene chlorosilane precursor gas may also be referred to as an alkylene halosilane precursor gas. For example, bis (trichlorosilyl) methane ($(SiCl_3)_2CH_2$, abbreviation: BTCSM) gas, an ethylene bis (trichlorosilane) gas, i.e., 1,2-bis (trichlorosilyl) ethane ($(SiCl_3)_2C_2H_4$, abbreviation: BTCSE) gas or the like, may be used as the alkylene chlorosilane precursor gas. It can be said that these gases are precursor gases containing at least two Si atoms in one molecule, further containing C atoms and Cl atoms, and having Si—C bonds. These gases act as a Si source and also as a C source in a film forming process to be described later.

For example, a precursor gas containing Si, Cl and an alkyl group and having a Si—C bond, i.e., an alkylchlorosilane precursor gas which is an organic chlorosilane precursor gas, may also be used as the halosilane precursor gas. The alkyl group includes a methyl group, an ethyl group, a propyl group, a butyl group or the like. The alkylchlorosilane precursor gas may also be referred to as an alkylhalosilane precursor gas. Examples of the alkylchlorosilane precursor gas may include 1,1,2,2-tetrachloro-1,2-dimethyldisilane ($(CH_3)_2Si_2Cl_4$, abbreviation: TCDMDS) gas, 1,2-dichloro-1,1,2,2-tetramethyldisilane ($(CH_3)_4Si_2Cl_2$, abbreviation: DCTMDS) gas, 1-monochloro-1,1,2,2,2-pentamethyldisilane ($(CH_3)_5Si_2Cl$, abbreviation: MCPMDS) or the like. It can be said that these gases are precursor gases containing at least two Si atoms in one molecule, further containing C and Cl atoms, and having Si—C bonds. These gases also have Si—Si bonds. These gases act as a Si source and also as a C source in a film forming process to be described later.

In the case of using HCDS, BTCSM, TCDMDS or other precursor gas which stays in a liquid state under room temperature and atmospheric pressure, the precursor in a liquid state may be vaporized by a vaporization system such as a vaporizer or a bubbler, and may be supplied as a precursor gas (HCDS gas, BTCSM gas, TCDMDS gas, etc.).

From the gas supply pipe 232a, for example, a C-containing gas as a reaction gas having a chemical structure (molecular structure) different from that of the precursor gas is supplied into the process chamber 201 via the MFC 241a, the valve 243a and the nozzle 249a. For example, a hydrocarbon-based gas may be used as the C-containing gas. The hydrocarbon-based gas may also be referred to as a material containing only two elements C and H, and may act as a C source in a film forming process to be described later. For example, propylene ($C_3H_6$) gas may be used as the hydrocarbon-based gas.

From the gas supply pipe 232b, for example, an O-containing gas as a reaction gas having a chemical structure different from that of the precursor gas is supplied into the process chamber 201 via the MFC 241b, the valve 243b and the nozzle 249b. The O-containing gas acts as an oxidizing gas, i.e., an O source, in a film forming process to be described later. As the O-containing gas, for example, oxygen ($O_2$) gas may be used.

From the gas supply pipe 232b, for example, a gas containing N and H as a reaction gas having a chemical structure different from that of the precursor gas is supplied into the process chamber 201 via the MFC 241b, the valve 243b and the nozzle 249b.

For example, a hydrogen-nitride-based gas may be used as the gas containing N and H. The hydrogen-nitride-based gas is a material containing only two elements of N and H, and acts as a nitriding gas, i.e., an N source, in a film forming process to be described later. For example, ammonia ($NH_3$) gas may be used as the hydrogen-nitride-based gas.

Further, for example, an amine-based gas which is a gas containing N, C and H may also be used as the gas containing N and H. The amine-based gas may also be referred to as a material containing only three elements N, C and H, and may also be referred to as a gas containing N and C. The amine-based gas acts as an N source and also as a C source in a film forming process to be described later. For example, triethylamine ($(C_2H_5)_3N$, abbreviation: TEA) gas may be used as the amine-based gas.

Moreover, for example, an organic hydrazine-based gas which is a gas containing N, C and H may also be used as the gas containing N and H. The organic hydrazine-based gas may also be referred to as a material containing only three elements N, C, and H, and may also be referred to as a gas containing N and C. The organic hydrazine-based gas acts as an N source and also as a C source in a film forming process to be described later. For example, trimethylhydrazine ($(CH_3)_2N_2(CH_3)H$, abbreviation: TMH) gas may be used as the organic hydrazine-based gas.

From the gas supply pipe 232b, for example, a boron (B)-containing gas as a reaction gas having a chemical structure different from that of the precursor gas is supplied into the process chamber 201 via the MFC 241b, the valve 243b and the nozzle 249b. The B-containing gas acts as a B source in a film forming process to be described later. For example, trichloroborane ($BCl_3$) gas may be used as the B-containing gas.

From the gas supply pipes 232c and 232d, for example, nitrogen ($N_2$) gas as an inert gas is supplied into the process chamber 201 via the MFCs 241c and 241d, the valves 243c and 243d, the gas supply pipes 232a and 232b, and the nozzles 249a and 249b.

In the case of supplying the precursor gas from the gas supply pipe 232a, a precursor gas supply system as a first supply system mainly includes the gas supply pipe 232a, the MFC 241a, and the valve 243a. The nozzle 249a may be included in the precursor gas supply system. The precursor gas supply system may be referred to as a precursor supply system. In the case where a halosilane precursor gas is supplied from the gas supply pipe 232a, the precursor gas supply system may also be referred to as a halosilane precursor gas supply system or a halosilane precursor supply system.

In the case of supplying the C-containing gas from the gas supply pipe 232a, a C-containing gas supply system mainly includes the gas supply pipe 232a, the MFC 241a and the valve 243a. The nozzle 249a may be included in the C-containing gas supply system. In the case where a hydrocarbon-based gas is supplied from the gas supply pipe 232a, the C-containing gas supply system may also be referred to as a hydrocarbon-based gas supply system or a hydrocarbon supply system. Also, the C-containing gas supply system may be included in the first gas supply system.

In the case of supplying the O-containing gas from the gas supply pipe 232b, an O-containing gas supply system mainly includes the gas supply pipe 232b, the MFC 241b and the valve 243b. The nozzle 249b may be included in the O-containing gas supply system. The O-containing gas supply system may also be referred to as an oxidizing gas supply system or an oxidizer supply system.

In the case of supplying the gas containing N and H from the gas supply pipe 232b, an N-and-H-containing gas supply system mainly includes the gas supply pipe 232b, the MFC 241b and the valve 243b. The nozzle 249b may be included in the N-and-H-containing gas supply system. The N-and-H-containing gas supply system may also be referred to as a nitriding gas supply system or a nitriding agent supply system. In the case where a hydrogen-nitride-based gas, an amine-based gas or an organic hydrazine-based gas is supplied as the gas containing N and H, the N-and-H-containing gas supply system may be referred to as a hydrogen-nitride-based gas supply system, an amine-based gas supply system or an organic hydrazine-based gas supply system.

In the case of supplying the B-containing gas from the gas supply pipe 232b, a B-containing gas supply system mainly includes the gas supply pipe 232b, the MFC 241b and the valve 243b. The nozzle 249b may be included in the B-containing gas supply system.

Any one or all of the C-containing gas supply system, the O-containing gas supply system, the N-and-H-containing gas supply system and the B-containing gas supply system may be referred to as a reaction gas supply system or a reactant supply system as a second supply system.

Further, an inert gas supply system mainly includes the gas supply pipes 232c and 232d, the MFCs 241c and 241d, and the valves 243c and 243d. The inert gas supply system may also be referred to as a purge gas supply system or a carrier gas supply system.

An exhaust pipe 231 configured to exhaust an internal atmosphere of the process chamber 201 is installed in the reaction tube 203. A vacuum pump 246 as a vacuum exhaust device is connected to the exhaust pipe 231 via a pressure sensor 245 as a pressure detector (pressure detection part), which detects a pressure inside the process chamber 201, and an auto pressure controller (APC) valve 244 as a pressure regulator (pressure adjustment part). The APC valve 244 is a valve configured to perform or stop a vacuum exhausting operation of an interior of the process chamber 201 by opening and closing the APC valve 244 while operating the vacuum pump 246 and so that the pressure inside the process chamber 201 can be adjusted by adjusting the opening degree of the APC valve 244 based on pressure information detected by the pressure sensor 245 while operating the vacuum pump 246. An exhaust system mainly includes the exhaust pipe 231, the APC valve 244 and the pressure sensor 245. The vacuum pump 246 may be included in the exhaust system.

A seal cap 219, which serves as a furnace opening cover configured to hermetically seal a lower end opening of the manifold 209, is installed under the manifold 209. The seal cap 219 is configured to make contact with the lower end of the manifold 209 on a lower side in the vertical direction. The seal cap 219 is made of metal such as stainless steel (SUS) or the like, and is formed in a disc shape. An O-ring 220b, which is a seal member making contact with the lower end portion of the manifold 209, is installed on an upper surface of the seal cap 219. A rotation mechanism 267 configured to rotate a boat 217, which will be described later, is installed on the opposite side of the seal cap 219 from the process chamber 201. A rotary shaft 255 of the rotation mechanism 267, which penetrates the seal cap 219, is connected to the boat 217. The rotation mechanism 267 is configured to rotate the wafers 200 by rotating the boat 217.

The seal cap 219 is configured to be vertically moved up and down by a boat elevator 115 which is an elevator mechanism vertically installed outside the reaction tube 203. The boat elevator 115 is configured to load and unload the boat 217 into and from the process chamber 201 by moving the seal cap 219 up and down. The boat elevator 115 is configured as a transfer device (transfer mechanism) which transfers the boat 217, i.e., the wafers 200, into and out of the process chamber 201. Furthermore, a shutter 219s as a furnace opening cover capable of hermetically sealing the lower end opening of the manifold 209 while lowering the seal cap 219 by the boat elevator 115 is installed under the manifold 209. The shutter 219s is made of metal such as stainless steel (SUS) or the like, and has a disc shape. An O-ring 220c as a seal member making contact with the lower end portion of the manifold 209 is installed on an upper surface of the shutter 219s. An opening/closing operation (a vertical movement operation or a rotational movement operation) of the shutter 219s is controlled by a shutter opening/closing mechanism 115s.

The boat 217 serving as a substrate support is configured to support a plurality of wafers 200, for example, 25 to 200 wafers, in such a state that the wafers 200 are arranged in a horizontal posture and in multiple stages along a vertical direction with the centers of the wafers 200 aligned with one another. That is to say, the boat 217 is configured to arrange the wafers 200 to be spaced-apart. The boat 217 is made of a heat resistant material such as quartz or SiC. Heat insulating plates 218 made of a heat resistant material such as quartz or SiC are installed below the boat 217 in multiple stages. With this configuration, the heat generated from the heater 207 is less likely to be transferred to the seal cap 219. However, the present embodiment is not limited to this configuration. For example, instead of installing the heat insulating plates 218 below the boat 217, a heat insulating cylinder as a cylindrical member made of a heat resistant material such as quartz or SiC may be installed under the boat 217.

A temperature sensor 263 serving as a temperature detector is installed in the reaction tube 203. Based on temperature information detected by the temperature sensor 263, a state of supplying electric power to the heater 207 is adjusted such that the interior of the process chamber 201 has a desired temperature distribution. Similar to the nozzles 249a and 249b, the temperature sensor 263 is formed in an L shape. The temperature sensor 263 is installed along the inner wall of the reaction tube 203.

Figure 3:
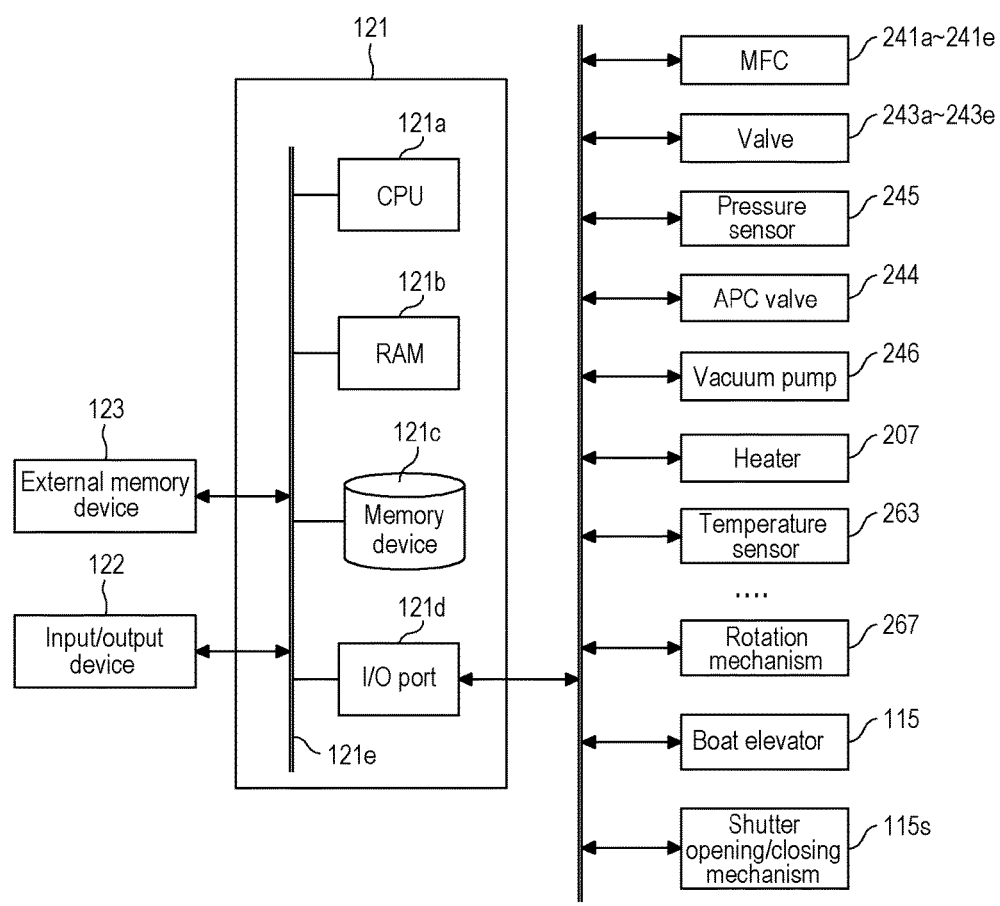
FIG. 3 is a schematic configuration diagram of a controller of the substrate processing apparatus suitably used in the first embodiment of the present disclosure, in which a control system of the controller is illustrated in a block diagram.

As illustrated in FIG. 3, a controller 121, which is a control part (control means), may be configured as a computer including a Central Processing Unit (CPU) 121a, a Random Access Memory (RAM) 121b, a memory device 121c, and an I/O port 121d. The RAM 121b, the memory device 121c and the I/O port 121d are configured to exchange data with the CPU 121a via an internal bus 121e. An input/output device 122 formed, for example, of a touch panel or the like, is connected to the controller 121.

The memory device 121c may include, for example, a flash memory, a Hard Disc Drive (HDD) or the like. A control program for controlling operations of a substrate processing apparatus, or a process recipe, in which sequences and conditions of a film forming process to be described later are written, are readably stored in the memory device 121c. The process recipe functions as a program for causing the controller 121 to execute each sequence in the film forming process, which will be described later, to obtain an expected result. Hereinafter, the process recipe and the control program will be generally and simply referred to as a "program." Furthermore, the process recipe will be simply referred to as a "recipe." When the term "program" is used herein, it may indicate a case of including only the recipe, a case of including only the control program or a case of including both the recipe and the control program. The RAM 121b is configured as a memory area (work area) in which a program or data read by the CPU 121a is temporarily stored.

The I/O port 121d is connected to the MFCs 241a to 241d, the valves 243a to 243d, the pressure sensor 245, the APC valve 244, the vacuum pump 246, the temperature sensor 263, the heater 207, the rotation mechanism 267, the boat elevator 115, the shutter opening/closing mechanism 115s or the like.

The CPU 121a is configured to read the control program from the memory device 121c and execute the same. The CPU 121a also reads the recipe from the memory device 121c according to an input of an operation command from the input/output device 122. In addition, the CPU 121a is configured to control, according to contents of the recipe thus read, the flow rate adjusting operation of various kinds of gases by the MFCs 241a to 241d, the opening/closing operation of the valves 243a to 243d, the opening/closing operation of the APC valve 244, the pressure adjusting operation performed by the APC valve 244 based on the pressure sensor 245, the driving and stopping of the vacuum pump 246, the temperature adjusting operation performed by the heater 207 based on the temperature sensor 263, the operation of rotating the boat 217 with the rotation mechanism 267 and adjusting the rotation speed of the boat 217, the operation of moving the boat 217 up and down with the boat elevator 115, the operation of opening and closing the shutter 219s with the shutter opening/closing mechanism 115s or the like.

The controller 121 may be configured by installing, on the computer, the aforementioned program stored in an external memory device 123 (e.g., a magnetic tape, a magnetic disc such as a floppy disc or a hard disc, an optical disc such as a CD or a DVD, a magneto-optical disc such as an MO, or a semiconductor memory such as a USB memory or a memory card). The memory device 121c or the external memory device 123 is configured as a non-transitory computer-readable recording medium. Hereinafter, the memory device 121c and the external memory device 123 will be generally and simply referred to as a "recording medium." When the term "recording medium" is used herein, it may indicate a case of including the memory device 121c, a case of including the external memory device 123, or a case of including both the memory device 121c and the external memory device 123. Furthermore, the program may be supplied to the computer using a communication means such as the Internet or a dedicated line, instead of using the external memory device 123.

(2) Film Forming Process

A sequence example of forming a film on a substrate using the aforementioned substrate processing apparatus, which is one of the processes for manufacturing a semiconductor apparatus (device), will be described below with reference to FIG. 4. In the following descriptions, the operations of the respective parts that are included in the substrate processing apparatus are controlled by the controller 121.

In the film formation process according to the present embodiment, a film is formed on a wafer 200 as a substrate by performing: supplying a precursor gas to the wafer 200 through a nozzle 249a as a first nozzle; and supplying at least one selected from a group consisting of an O-containing gas and an N-and-H-containing gas to the wafer 200 through a nozzle 249b as a second nozzle that is configured such that gas stagnation on a surface of the nozzle 249b caused by the nozzle 249b is less than gas stagnation on a surface of the nozzle 249a caused by the nozzle 249a, or such that contact of the nozzle 249b with gas staying on the surface of the nozzle 249b is less than contact of the nozzle 249a with gas staying on the surface of the nozzle 249a.

Figure 4:
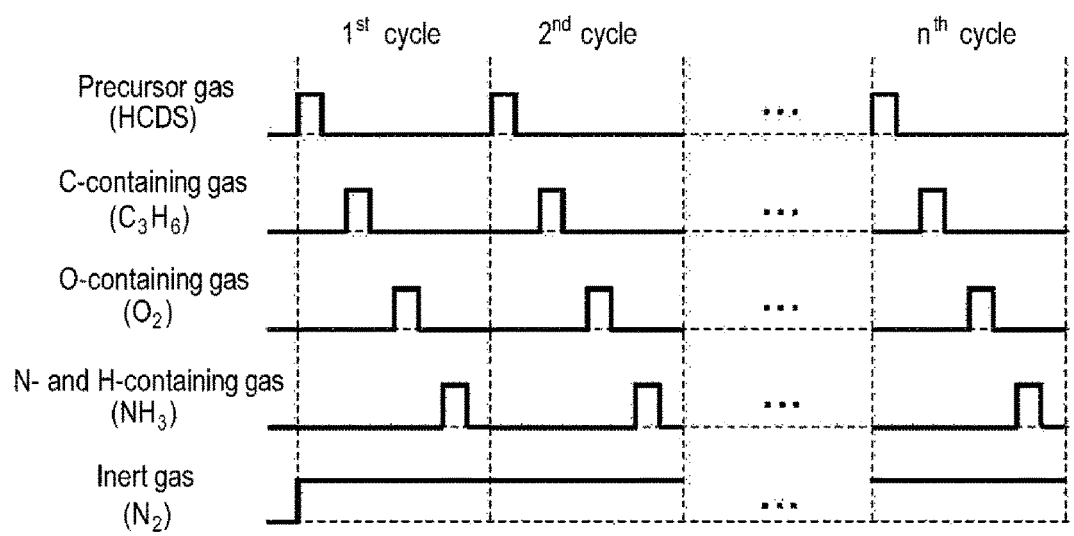
FIG. 4 is a view showing a film forming sequence according to the first embodiment of the present disclosure.

In the film forming sequence illustrated in FIG. 4, as an example, a film containing Si, O, C and N, i.e., a silicon oxycarbonitride film (SiOCN film), is formed on the wafer 200 by performing a cycle a predetermined number of times (n times), the cycle including non-simultaneously performing, i.e., without synchronization:

Step 1 of supplying HCDS gas to the wafer 200 through the nozzle 249a;

Step 2 of supplying $C_3H_6$ gas to the wafer 200 through the nozzle 249a;

Step 3 of supplying $O_2$ gas to the wafer 200 through the nozzle 249b; and

Step 4 of supplying $NH_3$ gas to the wafer 200 through the nozzle 249b.

In the present disclosure, for the sake of convenience, the film forming sequence illustrated in FIG. 4 may be denoted as follows. The same denotation will be used in the modifications and other embodiments to be described later.

$(HCDS \rightarrow C_3H_6 \rightarrow O_2 \rightarrow NH_3) \times n \Rightarrow SiOCN$ When the term "wafer" is used herein, it may refer to "a wafer itself" or "a laminated body (aggregate) of a wafer and a certain layer or film formed on the surface of the wafer." That is to say, a wafer including a certain layer or film formed on its surface may be referred to as a wafer. In addition, when the phrase "a surface of a wafer" is used herein, it may refer to "a surface (exposed surface) of a wafer itself" or "a surface of a certain layer or film formed on a wafer", namely "an uppermost surface of the wafer as a laminated body."

Accordingly, in the present disclosure, the expression "a predetermined gas is supplied to a wafer" may mean that "a predetermined gas is directly supplied to a surface (exposed surface) of a wafer itself" or that "a predetermined gas is supplied to a layer or film formed on a wafer, namely to an uppermost surface of a wafer as a laminated body." Furthermore, in the present disclosure, the expression "a predetermined layer (or film) is formed on a wafer" may mean that "a predetermined layer (or film) is directly formed on a surface (exposed surface) of a wafer itself" or that "a predetermined layer (or film) is formed on a layer or film formed on a wafer, namely on an uppermost surface of a wafer as a laminated body."

In addition, when the term "substrate" is used herein, it may be synonymous with the term "wafer."

(Substrate Preparation Step)

When a plurality of wafers 200 are charged onto the boat 217 (wafer charging), the shutter 219s is moved by the shutter opening/closing mechanism 115s to open the lower end opening of the manifold 209 (shutter opening). Thereafter, as illustrated in FIG. 1, the boat 217 supporting the plurality of wafers 200 is lifted up by the boat elevator 115 and is loaded into the process chamber 201 (boat loading). In this state, the seal cap 219 seals the lower end of the manifold 209 through the O-ring 220b.

(Pressure Adjustment and Temperature Adjustment Step)

The interior of the process chamber 201, namely the space in which the wafers 200 exist, is evacuated into a vacuum (evacuated into a reduced pressure) by the vacuum pump 246 so as to reach a desired pressure (desired degree of vacuum). In this case, the pressure inside the process chamber 201 is measured by the pressure sensor 245. The APC valve 244 is feedback-controlled based on the measured pressure information. The vacuum pump 246 may be continuously activated at least until the processing of the wafers 200 is completed. The wafers 200 in the process chamber 201 are heated by the heater 207 to a desired film forming temperature. In this case, the state of supplying electric power to the heater 207 is feedback-controlled based on the temperature information detected by the temperature sensor 263 such that the interior of the process chamber 201 has a desired temperature distribution. In addition, the heating of the interior of the process chamber 201 by the heater 207 may be continuously performed at least until the processing of the wafers 200 is completed. The rotation of the boat 217 and the wafers 200 by the rotation mechanism 267 is started. The rotation of the boat 217 and the wafers 200 by the rotation mechanism 267 may be continuously performed at least until the processing of the wafers 200 is completed.

(Film Forming Step)

Thereafter, the following four steps, i.e., Steps 1 to 4, are sequentially executed.

[Step 1]

In this step, HCDS gas is supplied to the wafers 200 in the process chamber 201.

Specifically, the valve 243a is opened to allow the HCDS gas to flow through the gas supply pipe 232a. A flow rate of the HCDS gas is adjusted by the MFC 241a. The HCDS gas is supplied into the process chamber 201 through the nozzle 249a and is exhausted from the exhaust pipe 231. In this operation, the HCDS gas is supplied to the wafers 200. Simultaneously, the valve 243c is opened to allow $N_2$ gas to flow through the gas supply pipe 232c. A flow rate of the $N_2$ gas is adjusted by the MFC 241c. The $N_2$ gas is supplied into the process chamber 201 together with the HCDS gas and is exhausted from the exhaust pipe 231.

In order to prevent the HCDS gas from entering the nozzle 249b, the valve 243d is opened to allow the $N_2$ gas to flow through the gas supply pipe 232d. The $N_2$ gas is supplied into the process chamber 201 through the gas supply pipe 232b and the nozzle 249b, and is exhausted from the exhaust pipe 231.

In this operation, the APC valve 244 is properly adjusted to set the pressure inside the process chamber 201 to a pressure falling within a range, for example, of 1 to 2,666 Pa, specifically 67 to 1,333 Pa. A supply flow rate of the HCDS gas controlled by the MFC 241a is set to a flow rate falling within a range, for example, of 1 to 2,000 sccm, specifically 10 to 1,000 sccm. A supply flow rate of the $N_2$ gas controlled by each of the MFCs 241c and 241d is set to a flow rate falling within a range, for example, of 100 to 10,000 sccm. A time period for supplying the HCDS gas to the wafers 200 is set to a time period falling within a range, for example, of 1 to 120 seconds, specifically 1 to 60 seconds. A temperature of the heater 207 is set to such a temperature that a temperature of the wafers 200 becomes a temperature, for example, of 250 to 700 degrees C., specifically 300 to 650 degrees C., more specifically 350 to 600 degrees C.

If the temperature of the wafers 200 is lower than 250 degrees C., HCDS is less likely to be chemically adsorbed to the wafers 200. Thus, a practical deposition rate may not be obtained in some cases. By setting the temperature of the wafers 200 to 250 degrees C. or higher, it is possible to solve this problem. By setting the temperature of the wafer 200 to 300 degrees C. or higher, ultimately 350 degrees C. or higher, HCDS can be sufficiently adsorbed to the wafers 200. Thus, a sufficient deposition rate can be obtained.

If the temperature of the wafers 200 is higher than 700 degrees C., an excessive gas phase reaction occurs. Thus, a film thickness uniformity tends to deteriorate, which makes it difficult to control the film thickness uniformity. By setting the temperature of the wafers 200 to 700 degrees C. or lower, it is possible to generate a proper gas phase reaction. This makes it possible to suppress deterioration of the film thickness uniformity and to control the film thickness uniformity. In particular, by setting the temperature of the wafers 200 to 650 degrees C. or lower, ultimately 600 degrees C. or lower, a surface reaction becomes dominant over the gas phase reaction. This makes it easy to secure the film thickness uniformity and to control the film thickness uniformity.

Accordingly, the temperature of the wafer 200 may be set to a temperature falling within a range of 250 to 700 degrees C., specifically 300 to 650 degrees C., more specifically 350 to 600 degrees C.

By supplying the HCDS gas to the wafers 200 under the above-mentioned conditions, a Si-containing layer containing Cl and having a thickness, for example, of less than one atomic layer to several atomic layers is formed as a first layer (initial layer) on an outermost surface of the wafer 200. As used herein, the description "a layer having a thickness of less than one atomic layer" means an atomic layer formed discontinuously, and the description "a layer having a thickness of one atomic layer" means an atomic layer formed continuously. The Si-containing layer containing Cl may be a Si layer containing Cl, an adsorption layer of HCDS or both of them. The Si layer containing Cl is a generic term that encompasses not only a continuous layer made of Si and containing Cl, but also a discontinuous layer or a Si thin film containing Cl, which is formed by overlapping these layers. The adsorption layer of HCDS includes not only a continuous adsorption layer including HCDS molecules, but also a discontinuous adsorption layer. Hereinafter, for the sake of convenience, the Si-containing layer containing Cl will also be simply referred to as Si-containing layer.

After the first layer is formed, the valve 243a is closed to stop a supply of the HCDS gas. In this operation, the interior of the process chamber 201 is evacuated by the vacuum pump 246 while opening the APC valve 244. Thus, the HCDS gas remaining inside the process chamber 201, which has not reacted or which has contributed to the formation of the first layer, is discharged from the interior of the process chamber 201. In this operation, a supply of the $N_2$ gas into the process chamber 201 is maintained while opening the valves 243c and 243d. The $N_2$ gas acts as a purge gas. This makes it possible to enhance the effect of discharging the gas remaining inside the process chamber 201 from the interior of the process chamber 201.

In this case, the gas remaining inside the process chamber 201 may not be completely discharged and the interior of the process chamber 201 may not be completely purged. If the amount of the gas remaining inside the process chamber 201 is small, an adverse effect is not generated in Step 2 which will be subsequently performed. A flow rate of the $N_2$ gas supplied into the process chamber 201 need not be made large. For example, an amount of the $N_2$ gas to be supplied into the process chamber 201 may be set substantially equal to a volume of the reaction tube 203 (the process chamber 201) such that a purge operation is performed without causing an adverse effect in Step 2. By not completely purging the interior of the process chamber 201 as described above, it is possible to shorten a time period for the purge and to improve the throughput. It is also possible to suppress a consumption of the $N_2$ gas to a necessary minimum level.

Besides the HCDS gas, for example, an organic halosilane precursor gas such as OCTS gas, dichlorosilane ($SiH_2Cl_2$, abbreviation: DCS) gas, monochlorosilane ($SiH_3Cl$, abbreviation: MCS) gas, tetrachlorosilane ($SiCl_4$, abbreviation: STC) gas, trichlorosilane ($SiHCl_3$, abbreviation: TCS) gas or the like may be used as the precursor gas.

Furthermore, an organic halosilane precursor gas such as BTCSE gas, BTCSM gas, TCDMDS gas, DCTMDS gas, MCPMDS gas or the like may be used as the precursor gas.

Furthermore, for example, an inorganic silane precursor gas containing no halogen group such as monosilane ($SiH_4$, abbreviation: MS) gas, disilane ($Si_2H_6$, abbreviation: DS) gas, trisilane ($Si_3H_8$, abbreviation: TS) or the like may be used as the precursor gas.

Furthermore, for example, an organic silane precursor gas containing no halogen group such as dimethylsilane ($SiC_2H_8$, abbreviation: DMS) gas, trimethylsilane ($SiC_3H_{10}$, abbreviation: TMS) gas, diethylsilane ($SiC_4H_{12}$, abbreviation: DES) gas, 1,4-disilabutane ($Si_2C_2H_{10}$, abbreviation: DSB) gas or the like may be used as the precursor gas.

Furthermore, for example, an amino (amine)-based silane precursor gas containing no halogen group such as trisdimethylaminosilane ($Si[N(CH_3)_2]_3H$, abbreviation: 3DMAS) gas, tetrakisdimethylaminosilane ($Si[N(CH_3)_2]_4$, abbreviation: 4DMAS) gas, bisdiethylaminosilane ($Si[N(C_2H_5)_2]_2H_2$, abbreviation: BDEAS) gas, bis(tertiary-butylamino) silane ($SiH_2[NH(C_4H_9)]_2$, abbreviation: BTBAS) gas, diisopropylaminosilane ($SiH_3N[CH(CH_3)_2]_2$, abbreviation: DIPAS) gas or the like may be used as the precursor gas.

When an organic halosilane precursor gas or an organic silane precursor gas which also acts as a C source is used as the precursor gas, it is possible to have C contained in the first layer. As a result, a C concentration in the SiOCN film finally formed on the wafer 200 may be made higher than that when an inorganic halosilane precursor gas or an inorganic silane precursor gas is used as the precursor gas. Furthermore, when an amino-based silane precursor gas which also acts as a C source and an N source is used as the precursor gas, it is possible to have C and N contained in the first layer. As a result, the C concentration and an N concentration in the SiOCN film finally formed on the wafer 200 may be made higher than those when an inorganic silane precursor gas is used as the precursor gas.

For example, a rare gas such as Ar gas, He gas, Ne gas, Xe gas or the like may be used as the inert gas, in addition to the $N_2$ gas.

[Step 2]

After Step 1 is completed, $C_3H_6$ gas is supplied to the wafer 200 in the process chamber 201, i.e., the first layer formed on the wafer 200.

In this step, the opening/closing control of the valves 243a, 243c and 243d is performed in the same procedure as the opening/closing control of the valves 243a, 243c and 243d in Step 1. A flow rate of the $C_3H_6$ gas is adjusted by the MFC 241a. The $C_3H_6$ gas is supplied into the process chamber 201 through the nozzle 249a and is exhausted from the exhaust pipe 231. In this operation, the $C_3H_6$ gas is supplied to the wafer 200.

A supply flow rate of the $C_3H_6$ gas controlled by the MFC 241a is set to a flow rate falling within a range, for example, of 100 to 10,000 sccm. The pressure inside the process chamber 201 is set to a pressure falling within a range, for example, of 1 to 5,000 Pa, specifically 1 to 4,000 Pa. By setting the pressure inside the process chamber 201 to such a relatively high pressure range, it becomes possible to thermally activate the $C_3H_6$ gas in a non-plasma manner. If the $C_3H_6$ gas is supplied by thermally activating the same, it is possible to generate a relatively soft reaction and it is easy to form a C-containing layer which will be described later. A time period for supplying the $C_3H_6$ gas to the wafer 200 is set to a time period falling within a range, for example, of 1 to 200 seconds, specifically 1 to 120 seconds, more specifically 1 to 60 seconds. Other processing conditions are, for example, the same as the processing conditions in Step 1.

In this operation, the gas flowing into the process chamber 201 is the thermally activated $C_3H_6$ gas, and the HCDS gas is not allowed to flow into the process chamber 201. Therefore, the $C_3H_6$ gas is supplied to the wafer 200 in an activated state without causing a gas phase reaction. As a result, a carbon-containing layer (C-containing layer) is formed on a surface of the first layer formed on the wafer 200 in Step 1. The C-containing layer may be a C layer, a $C_3H_6$ adsorption layer, or both of them. The C-containing layer needs to be a layer having a thickness of less than one molecular layer or less than one atomic layer, i.e., a discontinuous layer.

If the C-containing layer is formed as a continuous layer, the surface of the first layer is entirely covered with the C-containing layer. In this case, Si does not exist on a surface of the second layer. As a result, it may be difficult for the oxidizing reaction of the second layer in Step 3, to be described later, and the nitriding reaction of the third layer in Step 4, to be described later, to occur. This is because, under the processing conditions described above, O and N are bonded with Si, but it is difficult to be bonded with C. In order to generate a desired reaction in Step 3 or Step 4 to be described later, it is necessary that the adsorption state of the C-containing layer, for example, the chemisorption layer of $C_3H_6$, on the Si-containing layer containing Cl be made to become an unsaturated state, and Si be exposed on the surface of the second layer. By setting the processing conditions in Step 2 to processing conditions falling within the processing condition range described above, it is possible to have the C-containing layer become a discontinuous layer.

After the second layer is formed, the valve 243a is closed to stop the supply of the $C_3H_6$ gas. Then, according to the same processing procedure and processing conditions as in Step 1, the $C_3H_6$ gas remaining in the process chamber 201, which has not reacted or which has contributed to the formation of the C-containing layer, and reaction byproducts are discharged from the process chamber 201. In this operation, as in Step 1, the gas or the like remaining in the process chamber 201 may not be completely discharged.

A hydrocarbon-based gas such as acetylene ($C_2H_2$) gas, ethylene ($C_2H_4$) gas or the like may be used as the C-containing gas, in addition to the $C_3H_6$ gas.

For example, various rare gases exemplified in Step 1 may be used as the inert gas, in addition to the $N_2$ gas.

[Step 3]

After Step 2 is completed, $O_2$ gas is supplied to the wafer 200 in the process chamber 201, i.e., the second layer formed on the wafer 200.

In this step, the opening/closing control of the valves 243b to 243d is performed in the same procedure as the opening/closing control of the valves 243a, 243c and 243d in Step 1. A flow rate of the $O_2$ gas is adjusted by the MFC 241b. The $O_2$ gas is supplied into the process chamber 201 through the nozzle 249b and is exhausted from the exhaust pipe 231. In this operation, the $O_2$ gas is supplied to the wafer 200.

A supply flow rate of the $O_2$ gas controlled by the MFC 241b is set to a flow rate falling within a range, for example, of 100 to 10,000 sccm. The pressure inside the process chamber 201 is set to a pressure falling within a range, for example, of 1 to 4,000 Pa, specifically 1 to 3,000 Pa. By setting the pressure inside the process chamber 201 to such a relatively high pressure range, it is possible to thermally activate the $O_2$ in a non-plasma manner. If the $O_2$ gas is supplied by thermally activating the same, it is possible to generate a relatively soft reaction and to softly perform the oxidizing reaction to be described later. A time period for supplying the $O_2$ gas to the wafer 200 is set to a time period falling within a range, for example, of 1 to 120 seconds, specifically 1 to 60 seconds. Other processing conditions are, for example, the same as the processing conditions in Step 1.

In this operation, the gas flowing into the process chamber 201 is thermally activated $O_2$ gas. Neither the HCDS gas nor the $C_3H_6$ gas flows into the process chamber 201. Therefore, the $O_2$ gas is supplied to the wafer 200 in an activated state without causing a gas phase reaction. The $O_2$ gas supplied to the wafer 200 reacts with at least a part of the second layer formed on the wafer 200 in Step 2. Thus, the second layer is thermally oxidized in a non-plasma manner and is changed (modified) into a third layer containing Si, O and C, i.e., a silicon oxycarbide layer (SiOC layer). When the third layer is formed, impurities such as Cl or the like contained in the second layer form a gaseous substance containing at least Cl in a course of the modifying reaction using the $O_2$ gas. The gaseous substance is discharged from the interior of the process chamber 201. That is to say, impurities such as Cl and the like contained in the second layer are separated from the second layer by being pulled out or desorbed from the second layer. As a result, the third layer becomes a layer having fewer impurities such as Cl and the like than the second layer.

In this operation, the oxidizing reaction of the second layer is kept unsaturated. For example, in the case where a first layer having a thickness of several atomic layers is formed in Step 1 and a C-containing layer having a thickness of less than one atomic layer is formed in Step 2, at least a part of the surface layer (one atomic layer on the surface) of the second layer is oxidized. In this case, the oxidizing is carried out under such a condition that the oxidizing reaction of the second layer is kept unsaturated, so that the entire second layer is not oxidized. Depending on the conditions, several layers below the surface layer of the second layer may be oxidized. However, when oxidizing only the surface layer, a controllability of a composition ratio of the SiOCN film finally formed on the wafer 200 can be improved. Furthermore, for example, in the case where a first layer having a thickness of one atomic layer or less than one atomic layer is formed in Step 1 and a C-containing layer having a thickness of less than one atomic layer is formed in Step 2, a part of the surface layer of the second layer is oxidized in a similar manner. Even in this case, the oxidizing is carried out under such a condition that the oxidizing reaction of the second layer is kept unsaturated, so that the entire second layer is not oxidized. By setting the processing conditions in Step 3 to the processing conditions falling within the processing condition range described above, it becomes possible to make the oxidizing reaction of the second layer unsaturated.

In this operation, in particular, the above-mentioned processing conditions may be adjusted to increase a dilution ratio of the $O_2$ gas (decrease a concentration of the $O_2$ gas), shorten a supply time period of the $O_2$ gas or lower a partial pressure of the $O_2$ gas. For example, as compared with Steps 2 and 4, a dilution ratio of the reaction gas may be increased, a supply time period of the reaction gas may be shortened or a partial pressure of the reaction gas may be lowered. This makes it possible to moderately lower the oxidizing power in Step 3 and makes it easier to make the oxidizing reaction of the second layer unsaturated.

By lowering the oxidizing power in Step 3, it is possible to suppress desorption of C from the second layer in the course of oxidizing. Since an Si—O bond has a larger bonding energy than an Si—C bond, the Si—C bond tends to be broken when the Si—O bond is formed. On the other hand, by moderately lowering the oxidizing power in Step 3, it is possible to suppress breakage of the Si—C bond when the Si—O bond is formed in the second layer and to prevent C whose bond with Si is broken from being desorbed from the second layer.

In addition, by lowering the oxidizing power in Step 3, it is possible to maintain a state in which Si is exposed on an outermost surface of the oxidized second layer, i.e., the third layer. By maintaining the state in which Si is exposed on the outermost surface of the third layer, it becomes easy to nitride the outermost surface of the third layer in Step 4 to be described later. In the state in which an Si—O bond and an Si—C bond are formed throughout the outermost surface of the third layer and Si is not exposed on the outermost surface of the third layer, there is a tendency that an Si—N bond is less likely to be formed under the conditions of Step 4 to be described later. However, by maintaining the state in which Si is exposed on the outermost surface of the third layer, i.e., by making sure that Si capable of being bonded with N under the conditions of Step 4 to be described later is present on the outermost surface of the third layer, it becomes easy to form an Si—N bond.

After the third layer is formed, the valve 243b is closed to stop the supply of the $O_2$ gas. Then, according to the same processing procedure and processing conditions as in Step 1, the $O_2$ gas remaining in the process chamber 201, which has not reacted or which has contributed to the formation of the third layer, and reaction byproducts are discharged from the process chamber 201. In this operation, as in Step 1, the gas or the like remaining in the process chamber 201 may not be completely discharged.

An O-containing gas such as water vapor ($H_2O$ gas), nitrogen monoxide (NO) gas, nitrous oxide ($N_2O$) gas, nitrogen dioxide ($NO_2$) gas, carbon monoxide (CO) gas, carbon dioxide $CO_2$) gas, ozone ($O_3$) gas or the like may be used as the oxidizing gas, in addition to the $O_2$ gas.

For example, various rare gases exemplified in Step 1 may be used as the inert gas, in addition to the $N_2$ gas.

[Step 4]

After Step 3 is completed, $NH_3$ gas is supplied to the wafer 200 in the process chamber 201, i.e., the third layer formed on the wafer 200.

In this step, the opening/closing control of the valves 243b to 243d is performed in the same procedure as the opening/closing control of the valves 243a, 243c and 243d in Step 1. A flow rate of the $NH_3$ gas is adjusted by the MFC 241b. The $NH_3$ gas is supplied into the process chamber 201 through the nozzle 249b and is exhausted from the exhaust pipe 231. In this operation, the $NH_3$ gas is supplied to the wafer 200.

A supply flow rate of the $NH_3$ gas controlled by the MFC 241b is set to a flow rate falling within a range, for example, of 100 to 10,000 sccm. The pressure inside the process chamber 201 is set to a pressure falling within a range, for example, of 1 to 4,000 Pa, specifically 1 to 3,000 Pa. By setting the pressure inside the process chamber 201 to such a relatively high pressure range, it is possible to thermally activate the NH$_3$ gas in a non-plasma manner. If the NH$_3$ gas is supplied by thermally activating the same, it is possible to generate a relatively soft reaction and to softly perform the nitriding described later. A time period for supplying the NH$_3$ gas to the wafer 200 is set to a time period falling within a range, for example, of, 1 to 120 seconds, specifically 1 to 60 seconds. Other processing conditions are, for example, the same as the processing conditions in Step 1.

In this operation, the gas flowing into the process chamber 201 is thermally activated NH$_3$ gas. The HCDS gas, the C$_3$H$_6$ gas and the O$_2$ gas are not supplied into the process chamber 201. Therefore, the NH$_3$ gas is supplied to the wafer 200 in an activated state without causing a gas phase reaction. The NH$_3$ gas supplied to the wafer 200 reacts with at least a part of the third layer formed on the wafer 200 in Step 3. As a result, the third layer is thermally nitrided in a non-plasma manner and is changed (modified) into a fourth layer containing Si, O, C and N, i.e., a silicon oxycarbonitride layer (SiOCN layer). In forming the fourth layer, impurities such as Cl and the like contained in the third layer form a gaseous substance containing at least Cl in a course of the modifying reaction using the NH$_3$ gas. The gaseous substance is discharged from the interior of the process chamber 201. That is to say, impurities such as Cl and the like contained in the third layer are separated from the third layer by being pulled out or desorbed from the third layer. As a result, the fourth layer becomes a layer having fewer impurities such as Cl and the like than the third layer.

By supplying the activated NH$_3$ gas to the wafer 200, an outermost surface of the third layer is modified in the process of nitriding the third layer. The outermost surface of the third layer subjected to the surface modification process in the course of nitriding, i.e., an outermost surface of the fourth layer, becomes a surface state in which HCDS is easily adsorbed and Si is easily deposited in Step 1 to be performed in the next cycle. That is to say, the NH$_3$ gas used in Step 4 also acts as an adsorption or deposition promotion gas for promoting adsorption or deposition of HCDS or Si on the outermost surface of the fourth layer (the outermost surface of the wafer 200).

In this operation, the nitriding reaction of the third layer is kept unsaturated. For example, in the case where a third layer having a thickness of several atomic layers is formed in Steps 1 to 3, at least a part of the surface layer (one atomic layer on the surface) of the third layer is nitrided. In this case, the nitriding is performed under such conditions that the nitriding reaction of the third layer is kept unsaturated, so as not to nitride the entire third layer. Depending on conditions, several layers below the surface layer of the third layer may be nitrided. However, when nitriding only the surface layer of the third layer, the controllability of the composition ratio of the finally formed SiOCN film can be improved. Furthermore, for example, in the case where a third layer having a thickness of one atomic layer or less than one atomic layer is formed in Steps 1 to 3, a part of the surface layer of the third layer is similarly nitrided. Even in this case, the nitriding is performed under such conditions that the nitriding reaction of the third layer is kept unsaturated, so as not to nitride the entire third layer. By setting the processing conditions in Step 4 to conditions falling within the processing condition range described above, it is possible to make the nitriding reaction of the third layer unsaturated.

After the fourth layer is formed, the valve 243b is closed to stop the supply of the NH$_3$ gas. Then, according to the same processing procedure and processing conditions as in Step 1, the NH$_3$ gas remaining in the process chamber 201, which has not reacted or which has contributed to the formation of the fourth layer, and reaction byproducts are discharged from the process chamber 201. In this operation, as in Step 1, the gas or the like remaining in the process chamber 201 may not be completely discharged.

As the nitriding gas, in addition to the NH$_3$ gas, a hydrogen-nitride-based gas such as diazene (N$_2$H$_2$) gas, hydrazine (N$_2$H$_4$) gas, N$_3$H$_8$ gas or the like, a gas containing these compounds or the like may be used.

For example, various rare gases exemplified in Step 1 may be used as the inert gas, in addition to the N$_2$ gas.

(Performing a Predetermined Number of Times)

The cycle which non-simultaneously, i.e., non-synchronously, performs above-described four steps is performed a predetermined number of times (n times) to thereby form a SiOCN film having a predetermined composition and a predetermined thickness on the wafer 200. The above cycle may be repeated multiple times. That is to say, a thickness of the fourth layer formed per one cycle may be set to become smaller than a desired film thickness. The above cycle may be repeated multiple times until the film thickness of the SiOCN film formed by laminating the fourth layers becomes equal to the desired film thickness.

(After-Purge Step and Atmospheric Pressure Restoration Step)

After the film formation steps are completed, the N$_2$ gas is supplied into the process chamber 201 from the respective gas supply pipes 232c and 232d and is exhausted from the exhaust pipe 231. The N$_2$ gas acts as a purge gas. Thus, the interior of the process chamber 201 is purged, and the gas and reaction byproducts remaining in the process chamber 201 are removed from the interior of the process chamber 201 (after-purge). Thereafter, the atmosphere inside the process chamber 201 is substituted with an inert gas (inert gas substitution), and the pressure inside the process chamber 201 is restored to an atmospheric pressure (atmospheric pressure restoration).

(Unloading Step)

Then, the seal cap 219 is lowered by the boat elevator 115, the lower end of the manifold 209 is opened, and the processed wafers 200 are unloaded from the lower end of the manifold 209 outside of the reaction tube 203 in a state in which the processed wafers 200 are supported by the boat 217 (boat unloading). After the boat unloading, the shutter 219s is moved, and the lower end opening of the manifold 209 is sealed by the shutter 219s via the O-ring 220c (shutter closing). The processed wafers 200 are taken out from the boat 217 after they are unloaded outside of the reaction tube 203 (wafer discharging).

(3) Surface Shape of Nozzle

In the film forming process described above, Steps 1 to 4 are performed non-simultaneously. That is to say, after the residual gas and the like remaining in the process chamber 201 are removed, the precursor gas (the HCDS gas) and the reaction gas (the O$_2$ gas, the NH$_3$ gas, etc.) are supplied into the process chamber 201. This makes it possible to avoid a gas phase reaction between the precursor gas and the reaction gas in the process chamber 201, for example, a gas phase reaction between the HCDS gas and the O$_2$ gas, or a gas phase reaction between the HCDS gas and the NH$_3$ gas. As a result, it is possible to suppress generation of particles in the process chamber 201.

In the film forming process described above, in Steps 3 and 4, the O$_2$ gas and the NH$_3$ gas are supplied through the nozzle 249b differing from the nozzles 249a for supplying the HCDS gas. Furthermore, in Step 1, the N₂ gas is supplied into the nozzle 249b so as to prevent entry of the HCDS gas into the nozzle 249b. In addition, in Steps 3 and 4, the N₂ gas is supplied into the nozzle 249a so as to prevent entry of the O₂ gas and the NH₃ gas into the nozzle 249a. This makes it possible to avoid a gas phase reaction between the HCDS gas and the O₂ gas or a gas phase reaction between the HCDS gas and the NH₃ gas in the nozzles 249a and 249b. As a result, it is possible to suppress generation of particles in the nozzles 249a and 249b.

However, according to intensive research conducted by the inventors, it turned out that even when the film forming process is performed as described above, a large amount of particles may be generated in a vicinity of the nozzle 249b, and a large amount of particles may adhere to the wafer 200. Hereinafter, a generation mechanism of particles will be described in detail.

If the process of discharging the O₂ gas from the interior of the process chamber 201 is performed at the end of Step 3, the O₂ gas is discharged from the interior of the process chamber 201. However, even in this case, a trace amount of O₂ gas may remain in the gas supply pipe 232b or in the nozzle 249b. The O₂ gas remaining in the gas supply pipe 232b or in the nozzle 249b is mixed (encountered) with the NH₃ gas supplied into the gas supply pipe 232b in Step 4.

Further, if the process of discharging the NH₃ gas from the interior of the process chamber 201 is performed at the end of Step 4, the NH₃ gas is discharged from the interior of the process chamber 201. However, even in this case, a trace amount of NH₃ gas may remain in the gas supply pipe 232b or in the nozzle 249b. The NH₃ gas remaining in the gas supply pipe 232b or in the nozzle 249b is mixed (encountered) with the O₂ gas supplied into the gas supply pipe 232b in Step 3 of the next cycle.

If the O₂ gas and the NH₃ gas are mixed with each other, these gases react to generate nitric acid (NHO₃) or active radicals including an OH group (hereinafter, collectively and simply referred to as radicals and the like). The radicals and the like generated in the gas supply pipe 232b or the nozzle 249b are ejected (or injected) into the process chamber 201 through the gas supply hole 250b together with the O₂ gas and the NH₃ gas. It is presumed that NHO₃ is generated, for example, through the following process.

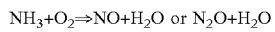
$NH_3 + O_2 \Rightarrow NO + H_2O$ or $N_2O + H_2O$

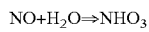
$NO + H_2O \Rightarrow NHO_3$

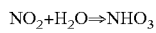
$NO_2 + H_2O \Rightarrow NHO_3$

Figure 5A:
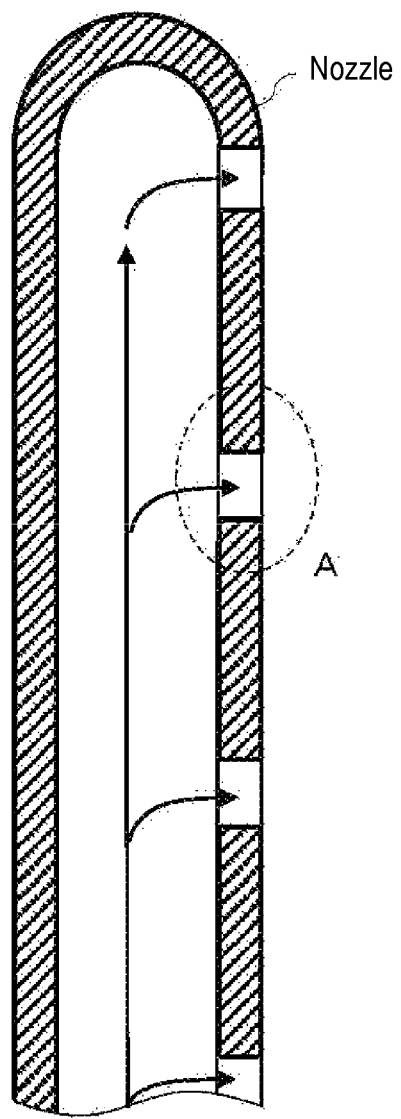
FIG. 5A is a vertical sectional view of a nozzle according to a comparative example.
Figure 5B:
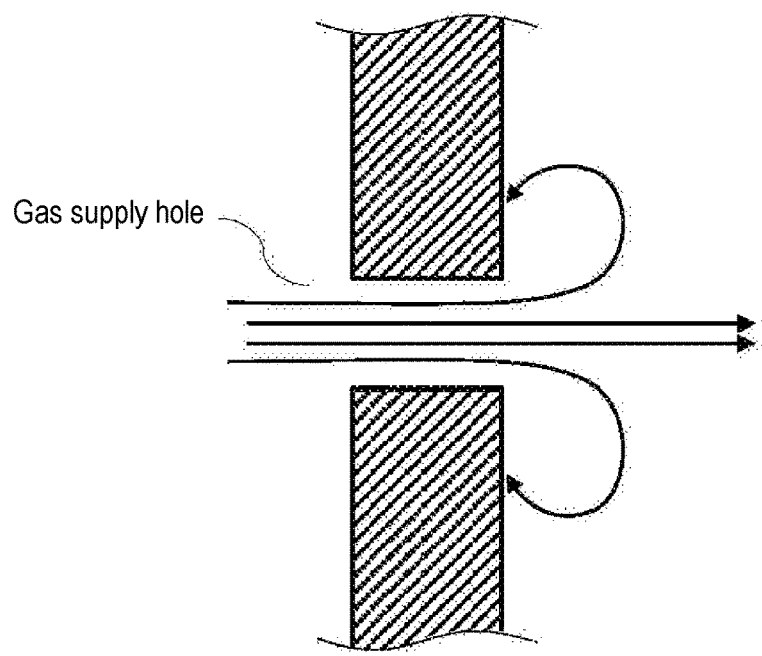
FIG. 5B is an enlarged sectional view illustrating a vicinity of a gas supply hole of the nozzle according to the comparative example.
Figure 6A:
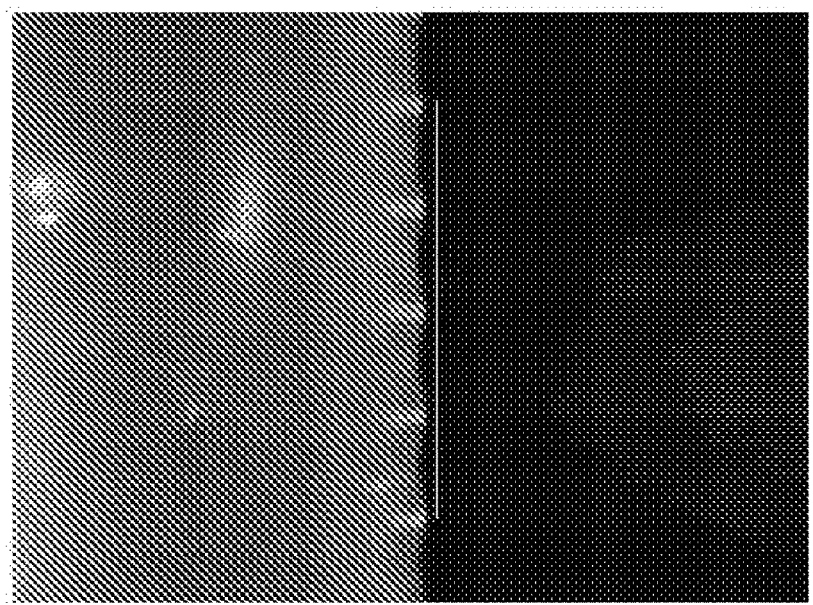
FIG. 6A is a view showing a surface (side surface) photograph of a nozzle after repeatedly performing a film forming process.
Figure 6B:
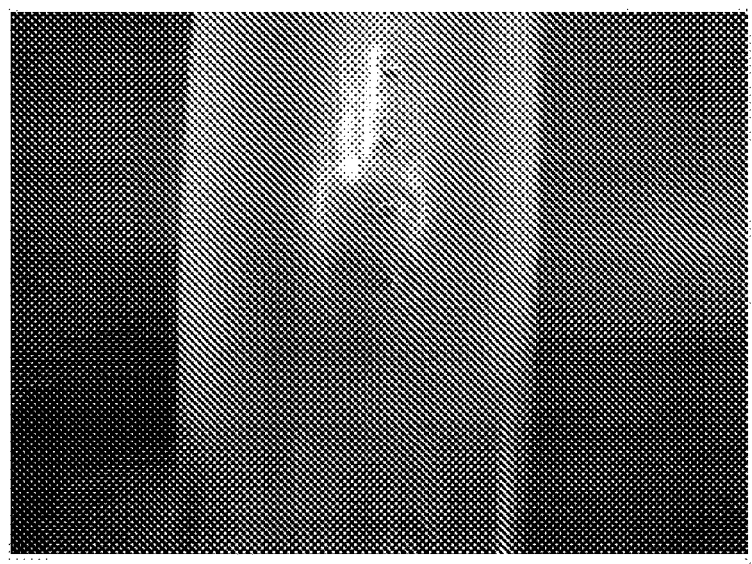
FIG. 6B is another surface (front surface) photograph of a nozzle after repeatedly performing a film forming process.

According to intensive research conducted by the inventors, it turned out that gas ejected through the gas supply holes may sometimes stay in the vicinity of a surface (outer circumferential surface or outer wall surface) of the nozzle, particularly in the vicinity of the gas supply holes. FIG. 5A illustrates how the gas flowing through the nozzle shown in a vertical sectional view is injected from the gas supply holes, and FIG. 5B illustrates how a part of the gas injected from the gas supply holes stays in the vicinity of the gas supply hole, i.e., around a surface of the nozzle. FIG. 5B is a partially enlarged view of a region A indicated in FIG. 5A. If the gas stays in the vicinity of the gas supply hole, the radicals and the like contained in the gas may make contact with the surface of the nozzle, whereby the surface of the nozzle may be etched. In a nozzle manufacturing process or the like, impurities including metallic elements such as iron (Fe), titanium (Ti) and aluminum (Al) may adhere to the surface of the nozzle, or may go into the surface of the nozzle. The radicals and the like contained in the gas staying around the gas supply hole may strongly react with these impurities when they make contact with the surface of the nozzle and may accelerate etching of the surface of the nozzle. FIGS. 6A and 6B show photographs of surfaces (i.e., a side surface and a front surface) of the nozzle after repeatedly performing the film forming process. According to these photographs, it can be noted that, by repeatedly performing the film forming process, the surface of the nozzle particularly around the gas supply hole is scraped, and the wall thickness of the nozzle is reduced. It was determined that a large amount of fine particles are generated in the vicinity of the nozzle due to this etching reaction.

According to intensive research conducted by the inventors, it was found that, by applying specific measures to a surface shape of the nozzle, it is possible to suppress etching of the nozzle and to suppress the generation of particles in the process chamber 201. Several Configuration Examples of the surface shape of the nozzle according to the present embodiment will be described below.

Configuration Example 1

Figure 7A:
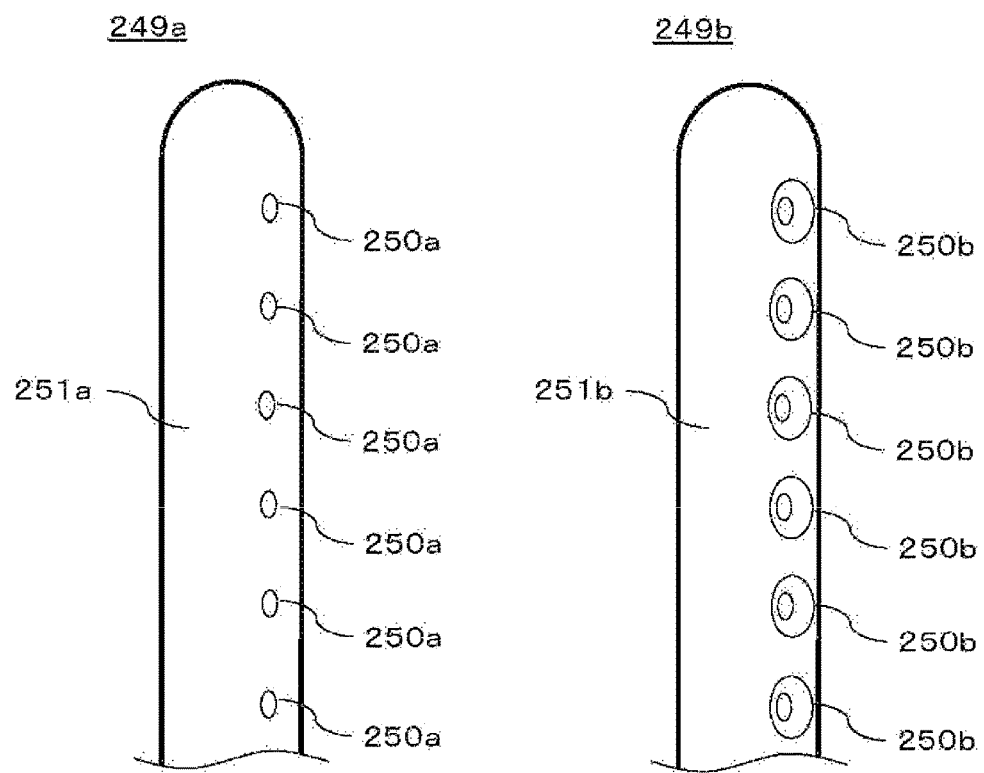
FIG. 7A is a perspective view of first and second nozzles in Configuration Example 1.

FIG. 7A is a perspective view showing main portions of the nozzles 249a and 249b according to the present Configuration Example. As described above, each of the nozzles 249a and 249b is configured as an L-shaped long nozzle, and their vertical portions are installed so as to extend upward from at least one end side toward the other end side of a wafer arrangement region. In the present disclosure, vertical portions of the nozzles 249a and 249b are referred to as tubular portions 251a and 251b, respectively. The tubular portions 251a and 251b are made of quartz or the like. Each of the tubular portions 251a and 251b is configured as a hollow (tubular) member whose tip (upper end) is sealed. Gas supply holes 250a and 250b are disposed in side peripheries (trunks) of the tubular portions 251a and 251b at predetermined intervals along a longitudinal direction, i.e., along an arrangement direction of the wafers 200. The gas supply holes 250a and 250b are formed to penetrate side walls of the side peripheries of the tubular portions 251a and 251b, respectively, along a radial direction of the tubular portions 251a and 251b, and are configured to inject gas toward the center of the reaction tube 203. As used herein, the description "the side peripheries of the tubular portions 251a and 251b" refers to portions of outer circumferential surfaces of the tubular portions 251a and 251b when the tubular portions 251a and 251b are viewed from a lateral side (in a horizontal direction, i.e., from the side of the wafers 200) along a gas injection direction, and means a wall (side wall) having an annular cross-sectional shape. The description "the side peripheral surfaces of the tubular portions 251a and 251b" refer to the outer peripheral surfaces of the tubular portions 251a and 251b when the tubular portions 251a and 251b are viewed from the lateral side.

Figure 7B:
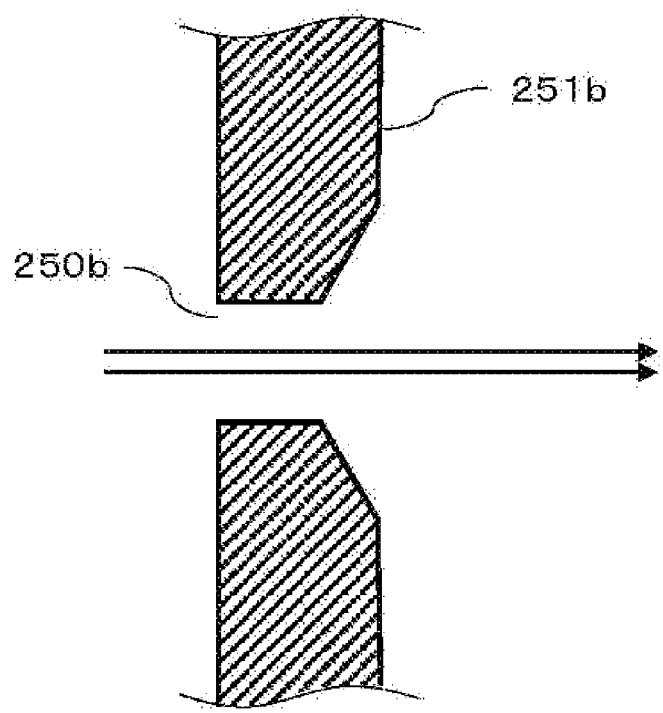
FIG. 7B is an enlarged sectional view illustrating a vicinity of a gas supply hole of a second nozzle in Configuration Example 1.

FIG. 7B is a partially enlarged view illustrating the vicinity of the gas supply hole 250b installed in the nozzle 249b according to the present Configuration Example. As illustrated in FIGS. 7A and 7B, in the nozzle 249b of the present Configuration Example, a shape of the gas supply hole 250b, at least on a side peripheral surface (gas outlet side) of the tubular portion 251b, is a trumpet structure (mortar structure). In other words, the gas supply hole 250b of the present Configuration Example has a structure in which at least a diameter (inner diameter) of a hole in a vicinity of the side peripheral surface of the tubular portion 251*b* gradually increases from a radial inner side to a radial outer side of the tubular portion 251*b*, i.e., in the gas injection direction.

Figure 8A:
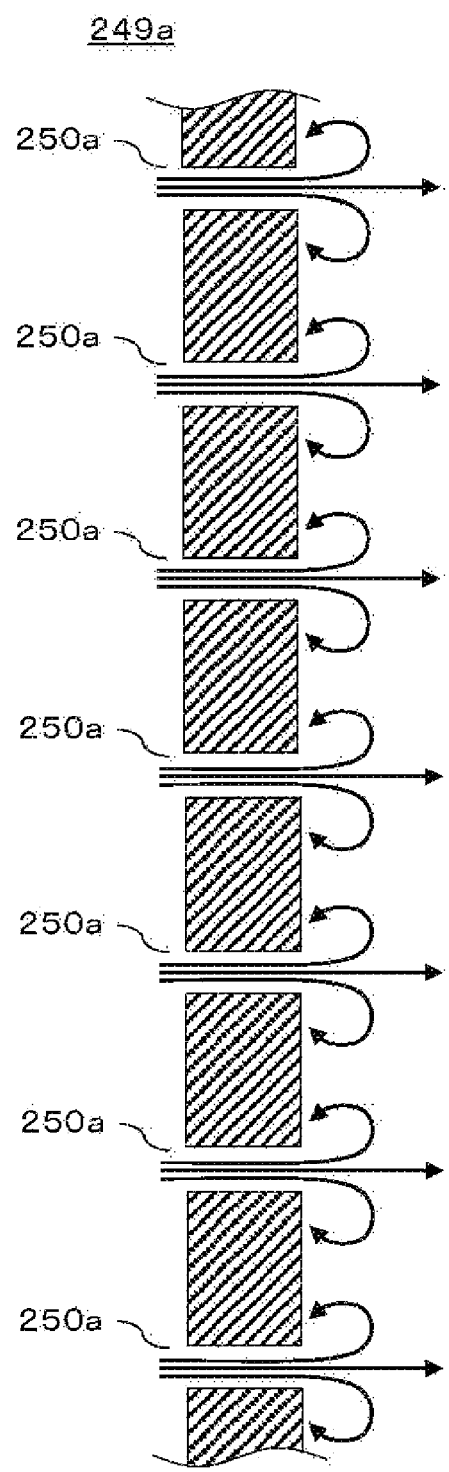
FIG. 8A is a vertical sectional view of a first nozzle in Configuration Example 1.
Figure 8B:
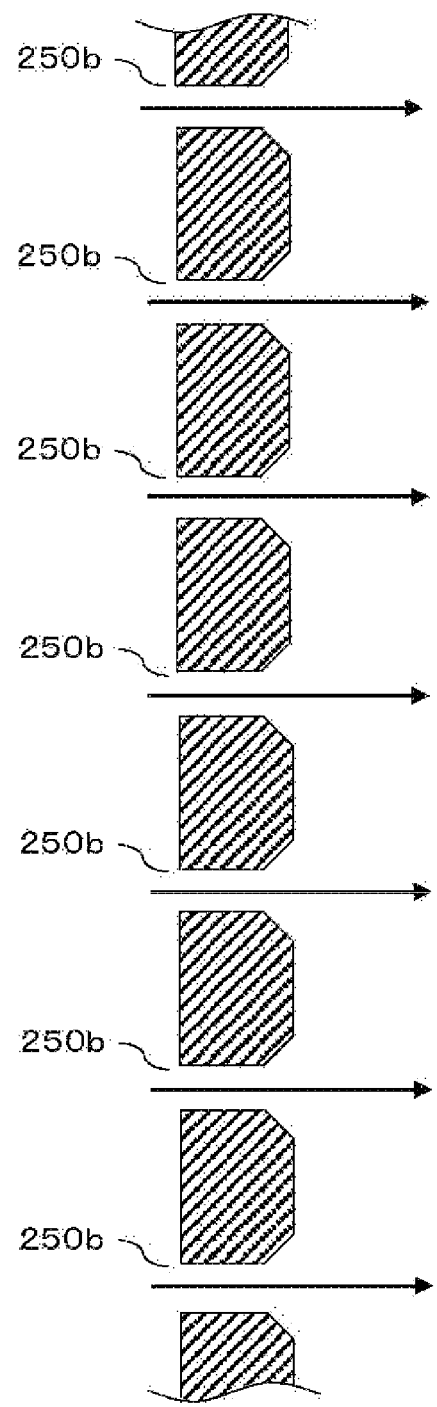
FIG. 8B is a vertical sectional view of a second nozzle in Configuration Example 1.

With this shape of the gas supply hole 250*b*, i.e., a surface shape of the nozzle 249*b*, when a gas is supplied into the process chamber 201 through the nozzle 249*b*, it is possible to make sure that stagnation of the gas is less likely to occur in the vicinity of the gas supply hole 250*b*. Arrows in FIGS. 7B and 8B indicate the flow of the gas near the gas supply hole 250*b*. As shown in FIGS. 7B and 8B, in the case of using the nozzle 249*b* of the present Configuration Example, the gas stagnation does not occur in the vicinity of the gas supply hole 250*b*. Even if the gas stagnation occurs, it is extremely small in scale and is at a negligible level. As a result, the radicals and the like generated by mixing the $O_2$ gas and the $NH_3$ gas are less likely to stay around the nozzle 249*b* and make less contact with the surface of the nozzle 249*b*.

Figure 8C:
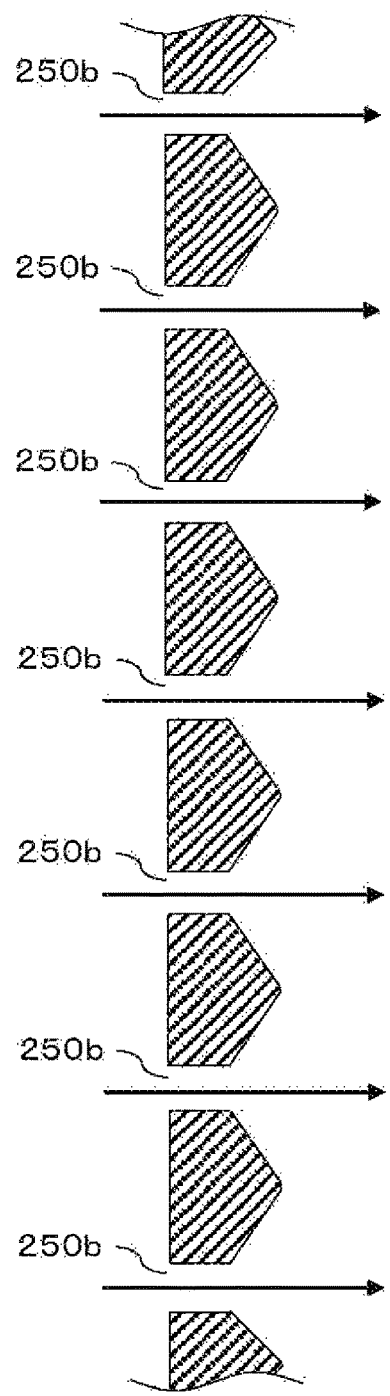
FIG. 8C is a vertical sectional view of a second nozzle in a modification of Configuration Example 1.

FIGS. 7C and 8C illustrate a modification of the nozzle 249*b* according to the present Configuration Example. In this modification, a plurality of gas supply holes 250*b* is disposed close to each other along the longitudinal direction of the tubular portion 251*b* in a so-called bead connection shape. In other words, the largest diameter portion (peripheral edge portion) of a predetermined gas supply hole among the plurality of gas supply holes 250*b* and the largest diameter portion (peripheral edge portion) of the gas supply hole 250*b* adjacent to the predetermined gas supply hole 250*b* are connected to each other without a gap or being overlap with each other on the side peripheral surface of the tubular portion 251*b*. By disposing the gas supply holes 250*b* in this manner, i.e., by making the surface shape of the nozzle 249*b* have such a shape, when supplying gas into the process chamber 201 through the nozzle 249*b*, it is possible to reliably suppress the gas stagnation in the vicinity of the gas supply hole 250*b*. As a result, as indicated by arrows in FIG. 8C, the radicals and the like generated by mixing the $O_2$ gas and the $NH_3$ gas make less contact with the nozzle 249*b*.

As illustrated in FIGS. 7A and 8C, in the nozzle 249*a* of the present Configuration Example, the above-mentioned trumpet structure is not provided in the gas supply hole 250*a*. In other words, similar to the gas supply hole illustrated in FIG. 5B, a diameter of a hole of the gas supply hole 250*a* is constant from a radial inner side toward a radial outer side of the tubular portion 251*a*, i.e., over the entire region in the gas injection direction. Since a surface shape of the nozzle 249*a* is simple, the manufacturing cost of the nozzle 249*a* can be reduced as compared with the nozzle 249*b*. If the surface shape of the nozzle 249*a* is set to such a shape, as indicated by arrows in FIG. 8A, the HCDS gas injected from the gas supply holes 250*a* may be likely to stay in a vicinity of the nozzle 249*a*. However, since the radicals and the like are not contained in the gas supplied from the gas supply holes 250*a*, the etching of the surface of the nozzle 249*a* cannot occur.

The outer diameters of the tubular portions 251*a* and 251*b* may be, for example, 20 to 30 mm, the minimum inner diameter of the gas supply holes 250*a* and 250*b* may be, for example, 0.5 to 4 mm, the maximum inner diameter of the gas supply hole 250*b* may be, for example, 3 to 20 mm, and the thickness of the side walls of the tubular portions 251*a* and 251*b*, i.e., length (depth) of the gas supply holes 250*a* and 250*b*, may be, for example, 2 to 4 mm. The configuration of the nozzle 249*a* remains the same in Configuration Examples 2 and 3 to be described later. By setting the inner diameter of the gas supply holes 250*a* and 250*b* as described above, it is possible to sufficiently obtain the above-mentioned effects.

Configuration Example 2

Figure 9A:
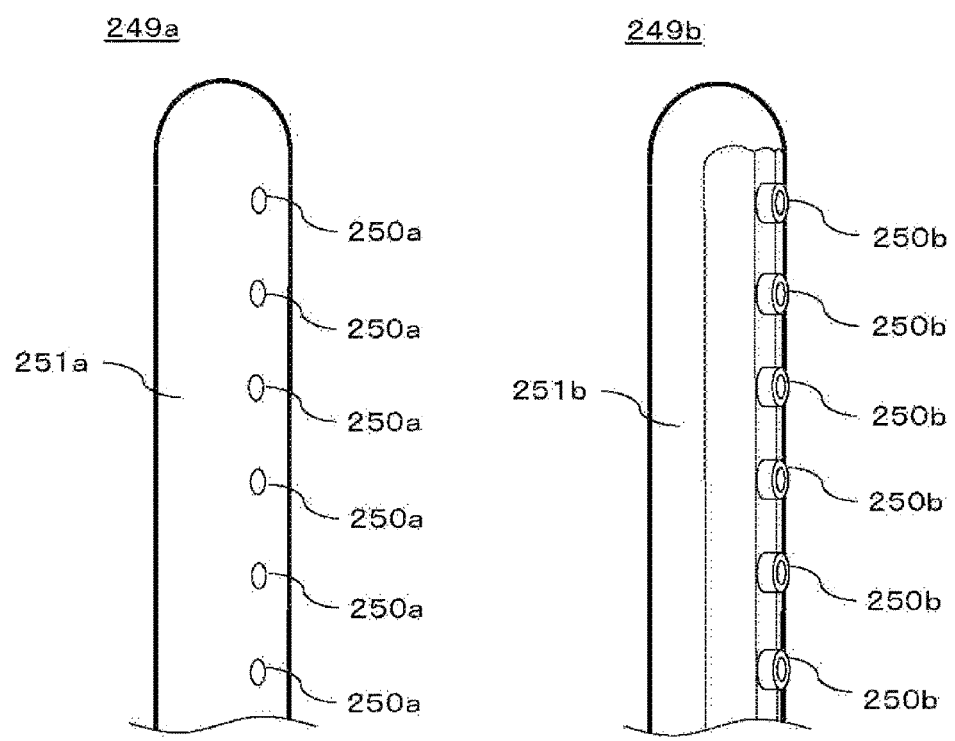
FIG. 9A is a perspective view of first and second nozzles in Configuration Example 2.

FIG. 9A is a perspective view showing the main portions of the nozzles 249*a* and 249*b* according to the present Configuration Example. The present Configuration Example is the same as Configuration Example 1 in that each of the nozzles 249*a* and 249*b* is configured as an L-shaped long nozzle, each of the tubular portions 251*a* and 251*b* as the vertical portions is configured as a hollow member made of quartz or the like, and a plurality of gas supply holes 250*a* and 250*b* is disposed along the longitudinal direction of the tubular portions 251*a* and 251*b*.

Figure 9B:
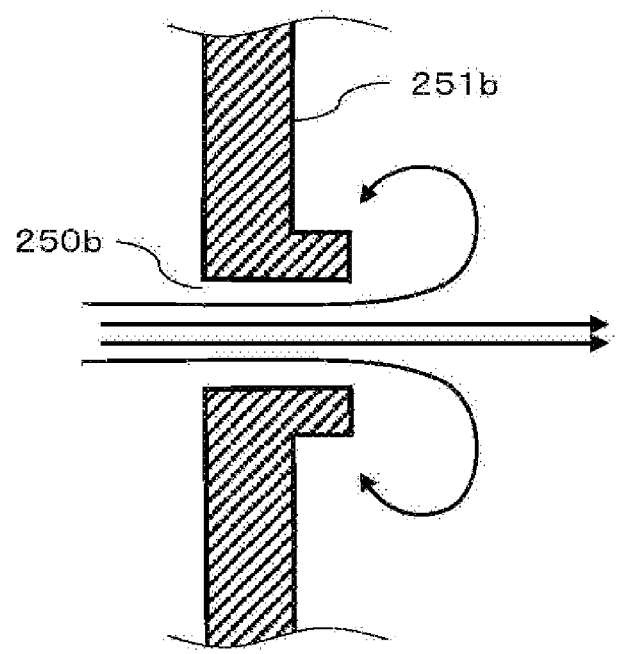
FIG. 9B is an enlarged sectional view illustrating a vicinity of a gas supply hole of a second nozzle in Configuration Example 2.

FIG. 9B is a partially enlarged view illustrating the vicinity of the gas supply hole 250*b* installed in the nozzle 249*b* according to the present Configuration Example. As illustrated in FIGS. 9A and 9B, in the nozzle 249*b* of the present Configuration Example, a shape of a gas injection portion including the gas supply hole 250*b* is a convex structure protruding toward the gas injection port. In other words, in the nozzle 249*b* of the present Configuration Example, the gas injection portion, which is an annular region that configures an opening of the gas supply hole 250*b* on the side peripheral surface of the tubular portion 251*b*, protrudes more outward than other regions of the tubular portion 251*b* (the peripheral region of the gas injection portion) from the radial inner side to the radial outer side of the tubular portion 251*b* so as to form a hollow protrusion portion.

By adopting the configuration of the gas supply hole 250*b*, i.e., the surface shape of the nozzle 249*b* as described above, when gas is supplied into the process chamber 201 through the nozzle 249*b*, the surface of the nozzle 249*b* makes less contact with the stagnant gas. Arrows in FIG. 9B indicate the flow of the gas in the vicinity of the gas supply hole 250*b*. As illustrated in FIG. 9B, when the nozzle 249*b* of Configuration Example 2 is used, even if the gas stagnation occurs in the vicinity of the gas supply hole 250*b*, the surface of the nozzle 249*b* makes less contact with the stagnant gas. That is to say, the surface of the nozzle 249*b* is spaced apart from the gas staying region (separated from the stagnant gas) by a distance corresponding to at least a height of the protrusion portion. Thus, the radicals or the like generated by mixing the $O_2$ gas and the $NH_3$ gas make less contact with the surface of the nozzle 249*b*. The height of the protrusion portion, i.e., a size of a step difference between the annular region configuring the opening of the gas supply hole 250*b* and the remaining region, may be, for example, 1 to 5 mm. By setting the height of a protrusion portion as described above, it is possible to sufficiently obtain the above-mentioned effects.

Figure 9C:
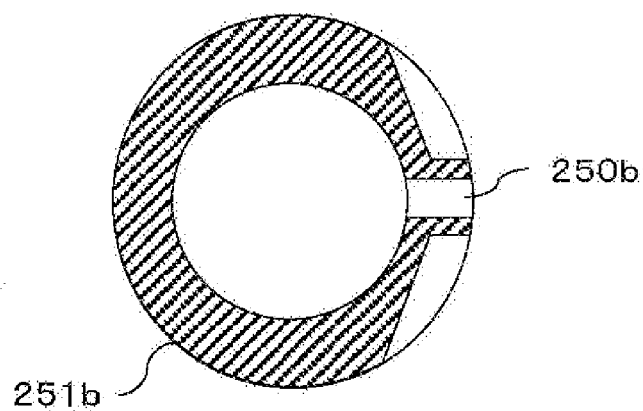
FIG. 9C is a horizontal sectional view of a second nozzle in Configuration Example 2.

When manufacturing the nozzle 249*b* of the present Configuration Example, instead of welding the protrusion portion to the side peripheral surface of the tubular portion 251*b*, the protrusion portion is formed by cutting (scraping). That is to say, as illustrated in FIG. 9C, the protrusion portion is formed by scraping a tubular quartz member to be processed into the tubular portion 251*b* while leaving a part of the tubular quartz member, so that the protrusion portion and the tubular portion 251*b* are integrally formed. If the protrusion portion is formed by scraping, it is possible to prevent impurities such as a metal and the like generated by welding from adhering to or entering into the surface of the nozzle 249*b*. Thus, it is possible to reduce the metal contamination amount in the process chamber 201. In addition, if the protrusion portion is formed by cutting, it is possible to reduce manufacturing costs of the nozzle 249b and to enhance the processing accuracy, as compared with a case where the protrusion portion is to the side peripheral surface of the tubular portion 251b. In the case of forming the protrusion portion by such a method, a region around the protrusion portion is configured as a flat surface as illustrated in FIGS. 9A and 9C.

As illustrated in FIG. 9A, in the nozzle 249a of the present Configuration Example, the above-described protrusion portion is not provided in the gas supply hole 250a. In other words, in the nozzle 249a of the present Configuration Example, the gas injection portion, which is an annular region configuring the gas supply hole 250a on a side peripheral surface of the tubular portion 251a, and the remaining region are present on the same surface (curved surface) that does not have a step difference. Since the surface shape of the nozzle 249a is simple, the manufacturing cost of the nozzle 249a can be reduced as compared with the nozzle 249b. If the surface shape of the nozzle 249a is set to such a shape, the HCDS gas injected from the gas supply hole 250a may stay in the vicinity of the nozzle 249a and may tend to make contact with the nozzle 249a. However, since the radicals and the like are not contained in the gas supplied from the gas supply hole 250a, the etching of the nozzle 249a cannot occur.

Configuration Example 3

Figure 10A:
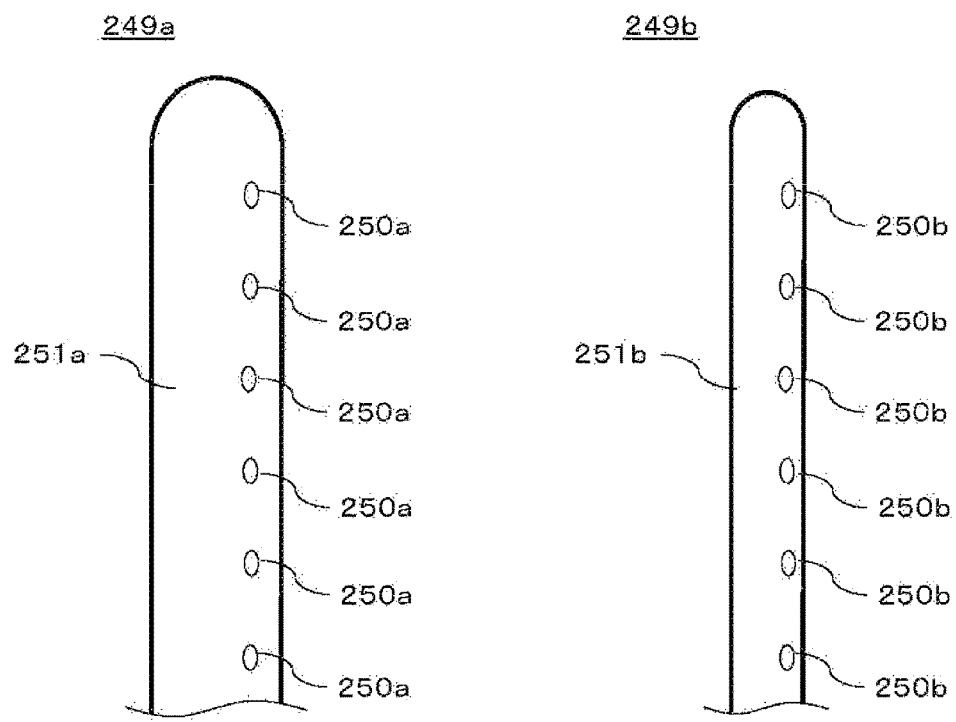
FIG. 10A is a perspective view of first and second nozzles in Configuration Example 3.

FIG. 10A is a perspective view showing the main portions of the nozzles 249a and 249b according to the present Configuration Example. The present Configuration Example is the same as Configuration Example 1 in that each of the nozzles 249a and 249b is configured as an L-shaped long nozzle, each of the tubular portions 251a and 251b as the vertical portions is configured as a hollow member made of quartz or the like, and a plurality of gas supply holes 250a and 250b is disposed along the longitudinal direction of the tubular portions 251a and 251b.

Figure 10B:
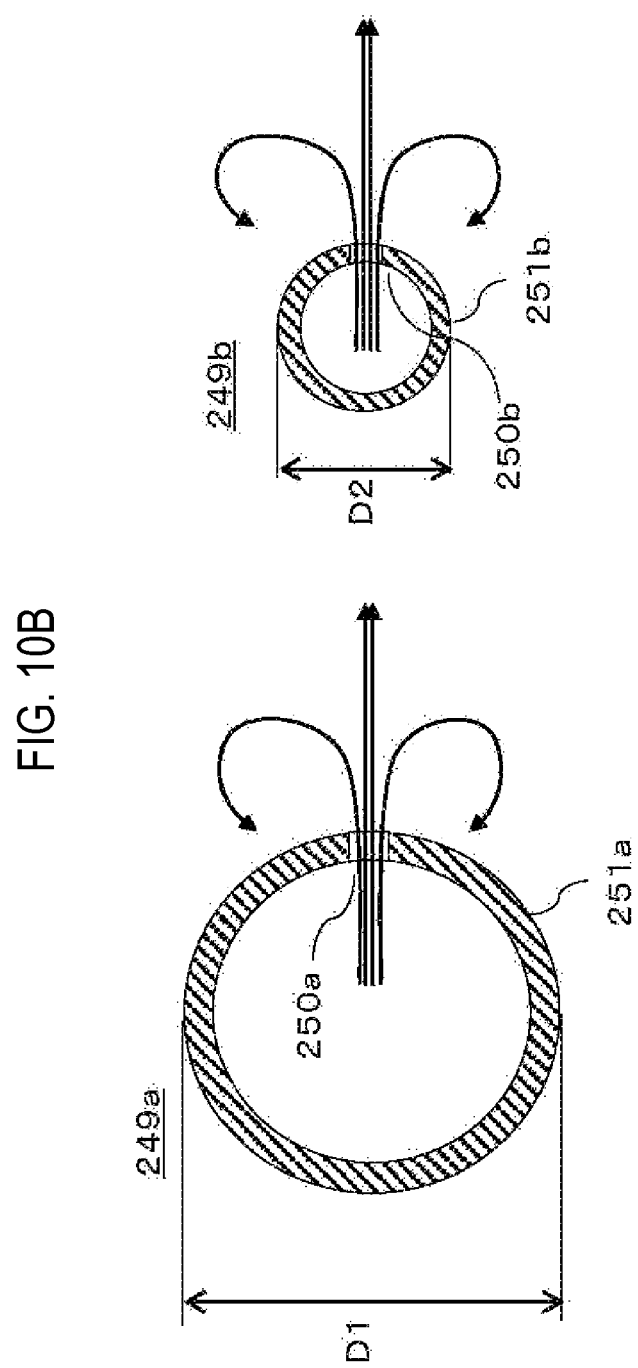
FIG. 10B is a horizontal sectional view of first and second nozzles in Configuration Example 3.

FIG. 10B is a horizontal sectional view of the nozzles 249a and 249b according to the present Configuration Example. As illustrated in FIGS. 10A and 10B, the outer diameter of the tubular portion 251b of the nozzle 249b is smaller than the outer diameter of the tubular portion 251a of the nozzle 249a. That is to say, the nozzle 249b is configured as a small-diameter nozzle having an outer diameter smaller than that of the nozzle 249a. As used herein, the description "the outer diameters of the tubular portions 251a and 251b" refers to widths of the tubular portions 251a and 251b when they are viewed from the lateral side along the gas injection direction, i.e., dimensions D1 and D2 indicated in FIG. 10B.

By setting a dimension of the cross section of the nozzle 249b as described above, when gas is supplied into the process chamber 201 through the nozzle 249b, the nozzle 249b makes less contact with the stagnant gas. Arrows in FIG. 10B indicate gas flows near the gas supply holes 250a and 250b. As shown in FIG. 10B, in the case of using the nozzle 249b of the present Configuration Example, even if gas stagnation occurs in the vicinity of the gas supply hole 250b, the stagnant gas makes less contact with the nozzle 249b (the contact area becomes narrow). That is to say, since the nozzle 249b of the present Configuration Example is configured as a small-diameter nozzle having an outer diameter smaller than that of the nozzle 249a, it is difficult for the nozzle 249b to make contact with the radicals and the like contained in the gas staying around the nozzle 249b. The outer diameter of the tubular portion 251a may be, for example, 20 to 30 mm, and the outer diameter of the tubular portion 251b may be, for example, 10 to 19 mm. By setting the outer diameters of the tubular portions 251a and 251b as described above, it is possible to sufficiently obtain the above-mentioned effects.

Figure 10C:
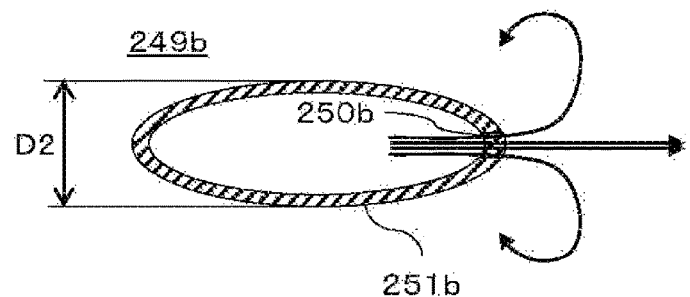
FIG. 10C is a horizontal sectional view of a second nozzle in a modification of Configuration Example 3.

FIG. 10C illustrates a modification of the nozzle 249b according to the present Configuration Example. As illustrated in FIG. 10C, a horizontal sectional shape of the tubular portion 251b, i.e., an outer cross-sectional shape of the tubular portion 251b in the plane orthogonal to the longitudinal direction of the tubular portion 251b, may be an ellipse. In this case, the gas supply hole 250b is installed in such an orientation as to inject the gas along a major axis direction of the ellipse, and a length of the minor axis of the ellipse is shorter (smaller) than the outer diameter of the tubular portion 251a in the nozzle 249a. By setting the horizontal sectional shape of the nozzle 249b to such a shape, it is possible to obtain the above-mentioned effects without reducing the cross-sectional area of the nozzle 249b, i.e., without decreasing flow rates of gases supplied from the nozzle 249b. The length of the major axis of the ellipse described above may be, for example, 20 to 30 mm, and a length of the minor axis of the ellipse may be, for example, 10 to 25 mm. By setting the lengths of the major axis and the minor axis as described above, it is possible to sufficiently obtain the above-mentioned effects.

The surface shapes of the nozzles 249a and 249b have been described above. These Configuration Examples 1 to 3 may be arbitrarily combined and used. In the case of adopting one of Configuration Examples 1 to 3, the gas supply holes 250a and 250b are opened by laser-processing the side peripheries of the tubular portions 251a and 251b and not by machining (drilling). In this case, it is possible to prevent impurities such as Fe, Ti, Al or the like contained in a cutting tool from adhering to or entering into the inner wall of the gas supply hole 250b. Thus, it is possible to reduce the metal contamination amount in the process chamber 201. In addition, if the gas supply holes 250a and 250b are opened by laser-processing, it is possible to shorten a time period needed for manufacturing the nozzles 249a and 249b and to enhance processing accuracy of the nozzles 249a and 249b, as compared with a case where the gas supply holes 250a and 250b are opened by drilling.

(4) Effects of the Present Embodiment

According to the present embodiment, one or more of the following effects may be obtained.

(a) By forming the surface shape of the nozzle 249b as described in the Configuration Example 1, when gas is supplied into the process chamber 201 through the nozzle 249b, the gas is less likely to stay in the vicinity of the gas supply hole 250b. That is to say, the radicals and the like generated by mixing the $O_2$ gas and the $NH_3$ gas make less contact with the surface of the nozzle 249b. As a result, it is possible to avoid the etching of the surface of the nozzle 249b, to suppress the generation of fine particles in the vicinity of the nozzle 249b, and to improve a quality of the film forming process. In addition, it is possible to extend the lifespan of the nozzle 249b and to reduce maintenance frequency.

When the plurality of gas supply holes 250b are arranged in a bead connection shape along the longitudinal direction of the tubular portion 251b, gas is less likely to stay around the nozzle 249b. This makes it possible to more reliably suppress the etching of the surface of the nozzle 249*b* which may occur due to the reaction with radicals and the like and to more reliably suppress the generation of fine particles in the vicinity of the nozzle 249*b*.

(b) By forming the surface shape of the nozzle 249*b* as described in the Configuration Example 2, when gas is supplied into the process chamber 201 through the nozzle 249*b*, the surface of the nozzle 249*b* makes less contact with the stagnant gas. That is to say, the radicals and the like generated by mixing the $O_2$ gas and the $NH_3$ gas make less contact with the surface of the nozzle 249*b*. As a result, it is possible to avoid the etching of the surface of the nozzle 249*b*, to suppress the generation of fine particles in the vicinity of the nozzle 249*b*, and to improve the quality of the film forming process. In addition, it is possible to extend the lifespan of the nozzle 249*b* and to reduce the maintenance frequency.

In manufacturing the nozzle 249*b* described in Configuration Example 2, if the protrusion portion is formed by cutting instead of welding the protrusion portion to the side peripheral surface of the tubular portion 251*b*, it is possible to prevent the impurities generated by the welding from adhering to the surface of the nozzle 249*b*. This makes it possible to reduce the metal contamination amount in the process chamber 201. In addition, it is possible to reduce the manufacturing cost of the nozzle 249*b* and to improve a processing accuracy of the manufacturing.

(c) By setting a cross-sectional dimension of the nozzle 249*b* as shown in the above-described Configuration Example 3, when gas is supplied into the process chamber 201 through the nozzle 249*b*, the surface of the nozzle 249*b* makes less contact with the stagnant gas. That is to say, the radicals and the like generated by mixing the $O_2$ gas and the $NH_3$ gas make less contact with the surface of the nozzle 249*b*. As a result, it is possible to suppress the etching of the surface of the nozzle 249*b*, to suppress the generation of fine particles in the vicinity of the nozzle 249*b*, and to improve the quality of the film forming process. In addition, it is possible to extend the lifespan of the nozzle 249*b* and to reduce the maintenance frequency.

(d) By opening the gas supply holes 250*a* and 250*b* by laser-processing the side peripheries of the tubular portions 251*a* and 251*b*, it is possible to reduce the metal contamination amount in the process chamber 201. In addition, it is possible to shorten the time period needed for manufacturing the nozzles 249*a* and 249*b* and to enhance the processing accuracy of the manufacturing.

(e) The above-described various effects may be similarly obtained even when not only the surface shape of the nozzle 249*b* but also the surface shape of the nozzle 249*a* is set to a shape of any one of Configuration Examples 1 to 3. However, the above-mentioned radicals or the like are not generated in the nozzle 249*a* for supplying the HCDS gas. Thus, even if the surface shape of the nozzle 249*a* is set to the shape of any one of Configuration Examples 1 to 3, it is difficult to obtain technical significance. Rather, only the nozzle 249*b* among the nozzles 249*a* and 249*b* may have a surface shape as described in Configuration Examples 1 to 3. By doing so, as compared with a case where both the nozzles 249*a* and 249*b* have surface shapes as described in Configuration Examples 1 to 3, it is possible to reduce the manufacturing cost of the nozzle group, i.e., the manufacturing cost of the substrate processing apparatus.

(f) The above-mentioned effects may be similarly obtained even in the case of using a silane precursor gas other than the HCDS gas, the case of using a C-containing gas other than the $C_3H_6$ gas, the case of using an O-containing gas other than the $O_2$ gas, and the case of using an N-and-H-containing gas other than the $NH_3$ gas.

(5) Modifications

The film forming sequence according to the present embodiment may be modified, for example, as in the following modifications.

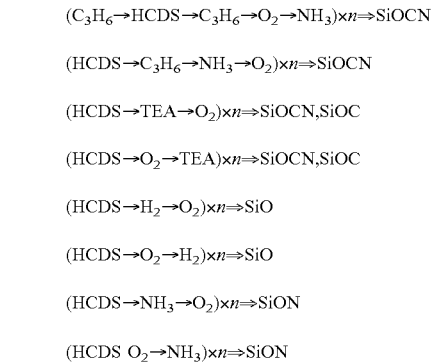

Furthermore, the film forming sequence according to the present embodiment may be modified, for example, as in the following modifications in which the O-containing gas is not used.

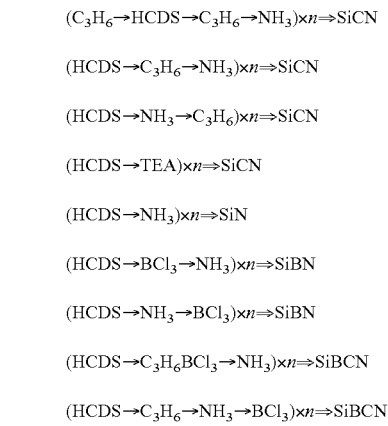

As in these modifications, by arbitrarily selecting and using the reaction gas or arbitrarily changing a supply order of the precursor gas and the reaction gas, it is possible to change the composition, the composition ratio, the film quality and the like of the film to be formed. Furthermore, it is possible to arbitrarily combine and use a plurality of kinds of reaction gases. For example, $C_3H_6$ gas may be added to (or mixed with) $NH_3$ gas, TEA gas or HCDS gas. This makes it possible to change the composition, the composition ratio, the film quality and the like of the film to be formed.

By using the silicon-based insulating film formed by the film forming sequence illustrated in FIG. 4 or each of the modifications as a side wall spacer, it is possible to provide a device forming technique which is small in leakage current and excellent in processing ability. Furthermore, by using the above-mentioned silicon based insulating film as an etching stopper, it is possible to provide a device forming technique which is excellent in processing ability. In addition, according to the film forming sequence illustrated in FIG. 4 or each of the modifications, it is possible to form a silicon-based insulating film having an ideal stoichiometric ratio without using plasma. Since the silicon-based insulating film can be formed without using plasma, the film forming sequence illustrated in FIG. 4 or each of the modifications may also be applied to a process in which plasma damage is concerned, for example, a process of forming an SADP film of DPT.

In the modifications described above, in the step of supplying the TEA gas to the wafer 200, a supply flow rate of the TEA gas controlled by the MFC 241b is set to a flow rate falling within a range, for example, of 100 to 10,000 sccm. The pressure inside the process chamber 201 is set to a pressure falling within a range, for example, of 1 to 5,000 Pa, specifically 1 to 4,000 Pa. A time period for supplying the TEA gas to the wafer 200 is set to a time period falling within a range, for example, of 1 to 200 seconds, specifically 1 to 120 seconds, more specifically 1 to 60 seconds. Other processing conditions are, for example, the same as the processing conditions in Step 4 of the film forming sequence illustrated in FIG. 4. It may be possible to use an ethylamine-based gas such as diethylamine $((C_2H_5)_2NH$, abbreviation: DEA) gas, monoethylamine $(C_2H_5NH_2$, abbreviation: MEA) gas or the like, or a methylamine-based gas such as trimethylamine $((CH_3)_3N$, abbreviation: TMA) gas, dimethylamine $((CH_3)_2NH$, abbreviation: DMA) gas, monomethylamine $(CH_3NH_2$, abbreviation: MMA) gas or the like as the gas containing N, C and H, in addition to the TEA gas. It may be possible to use an organic hydrazine-based gas such as TMH gas or the like as the gas containing N, C and H, in addition to the amine-based gas.

In the modifications described above, in the step of supplying the $BCl_3$ gas to the wafer 200, a supply flow rate of the $BCl_3$ gas controlled by the MFC 241b is set to a flow rate falling within a range, for example, of 100 to 10,000 sccm. The pressure inside the process chamber 201 is set to a pressure falling within a range, for example, of 1 to 2,666 Pa, specifically 67 to 1,333 Pa. A time period for supplying the $BCl_3$ gas to the wafer 200 is set to a time period falling within a range, for example, of 1 to 120 seconds, specifically 1 to 60 seconds. Other processing conditions are, for example, the same as the processing conditions in Step 4 of the film forming sequence illustrated in FIG. 4. It may be possible to use monochloroborane ($BClH_2$) gas, dichloroborane ($BCl_2H$) gas, trifluoroborane ($BF_3$) gas, tribromoborane ($BBr_3$) gas, diborane ($B_2H_6$) gas or the like as the B-containing gas, in addition to the $BCl_3$ gas.

The processing procedures and processing conditions in other steps may be, for example, the same as the processing procedures and processing conditions of the respective steps in the film forming sequence illustrated in FIG. 4.

Second Embodiment

In the present embodiment, CDS gas, $O_2$ gas and $NH_3$ gas are supplied into the process chamber 201 through separate nozzles.

Figure 11:
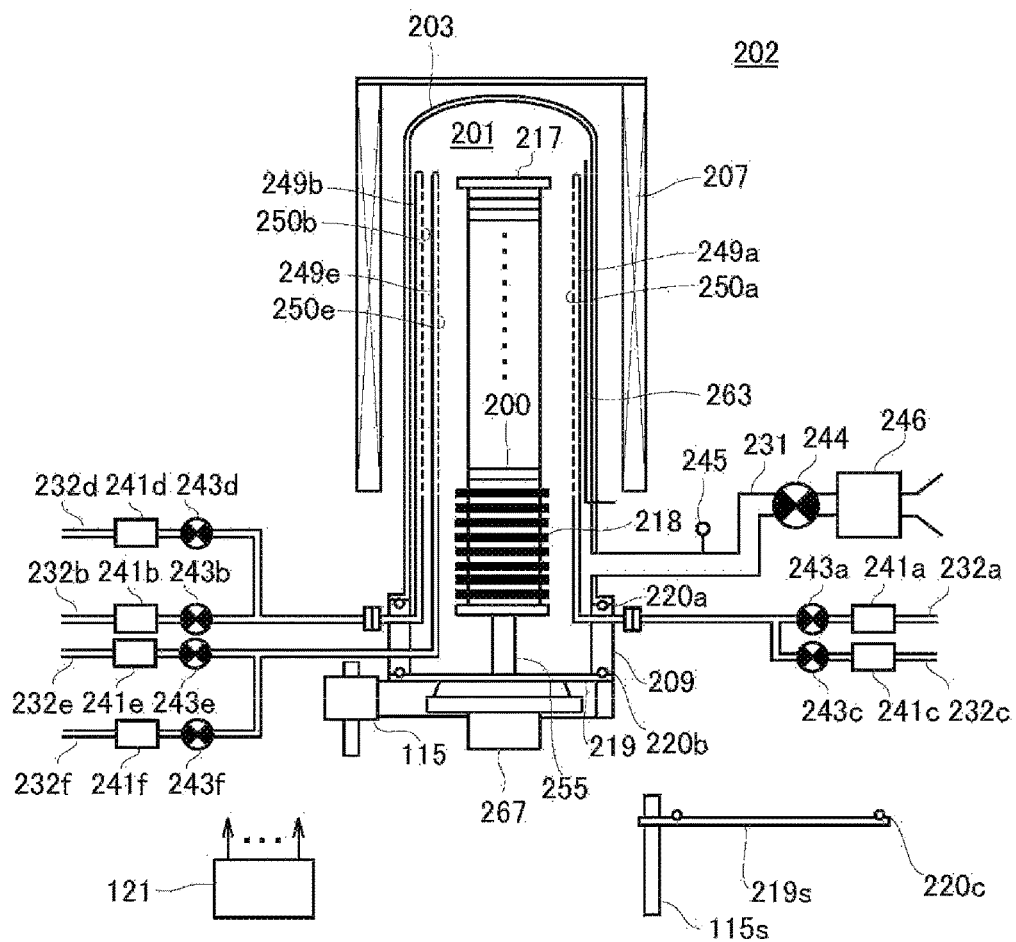
FIG. 11 is a schematic configuration view of a vertical processing furnace of a substrate processing apparatus suitably used in a second embodiment of the present disclosure, in which a portion of the processing furnace is illustrated in a vertical cross section.

FIG. 11 is a vertical sectional view showing a processing furnace of a substrate processing apparatus used in the present embodiment. In addition to the nozzles 249a and 249b, a nozzle 249e as a third nozzle is further installed in the process chamber 201. Similar to the nozzles 249a and 249b, the nozzle 249e is made of quartz and is installed with gas supply holes 250e. A gas supply pipe 232e is connected to the nozzle 249e. On the gas supply pipe 232e, an MFC 241e and a valve 243e are installed sequentially from the upstream side of the gas supply pipe 232e. A gas supply pipe 232f for supplying inert gas is connected to the gas supply pipe 232e on a downstream side of the valve 243e. On the gas supply pipe 232f, an MFC 241f and a valve 243f are installed sequentially from the upstream side of the gas supply pipe 232f. Other configurations are similar to those of the substrate processing apparatus illustrated in FIG. 1. Elements which are substantially the same as those described with reference to FIG. 1 are denoted by the same reference numerals, and the description of the elements is omitted.

Using the substrate processing apparatus illustrated in FIG. 11, a SiOCN film may be formed on the wafer 200 according to the film forming sequence illustrated in FIG. 4. In this case, for example, the supply of the HCDS gas and the $C_3H_6$ gas into the process chamber 201 is performed via the gas supply pipe 232a and the nozzle 249a as in the first embodiment. The supply of the $O_2$ gas into the process chamber 201 is performed via the gas supply pipe 232b and the nozzle 249b. The supply of the $NH_3$ gas into the process chamber 201 is performed via the gas supply pipe 232e and the nozzle 249e. The processing procedures and processing conditions may be the same as the processing procedures and processing conditions of the film forming process in the first embodiment.

Even in the present embodiment, each of surface shapes of the nozzles 249b and 249e is configured as in any one of Configuration Examples 1 to 3 of the first embodiment, and the surface shape of the nozzle 249a is configured to be the same as the surface of the nozzle 249a of the first embodiment, whereby the same effects as in the first embodiment may be obtained. Furthermore, the surface shape of the nozzle 249e may be configured as in any one of Configuration Examples 1 to 3 of the first embodiment, and each of the surface shapes of the nozzles 249a and 249b may be configured to be the same as the surface shape of the nozzle 249a of the first embodiment. Even in this case, the same effects as in the first embodiment may be obtained.

Other Embodiments

The embodiments of the present disclosure have been concretely described above. However, the present disclosure is not limited to the embodiments described above, and various modifications may be made without departing from the spirit of the present disclosure.

The film forming sequence described in the above embodiment may be suitably applied to a case where an oxide film containing a metal element such as titanium (Ti), zirconium (Zr), hafnium (Hf), tantalum (Ta), niobium (Nb), molybdenum (Mo), tungsten (W), yttrium (Y), lanthanum (La), strontium (Sr), aluminum (Al) or the like, i.e., a metal-based thin film such as a metal-based oxide film or the like, is formed on a wafer. In other words, the above-described film forming sequence may be suitably applied to a case where an oxycarbonitride film, an oxycarbide film, an oxide film, an oxynitride film, a carbonitride film, a nitride film, a boronitride film, or a borocarbonitride film containing a metal element such as Ti, Zr, Hf, Ta, Nb, Mo, W, Y, La, Sr, Al or the like is formed on a wafer.

When a metal-based thin film such as a metal-based oxide film or the like is formed, for example, an inorganic metal precursor gas containing a metal element and a halogen element, such as titanium tetrachloride ($TiCl_4$) gas or the like may be used as the precursor gas. Furthermore, as the precursor gas, it may also be possible to use, for example, an organic metal precursor gas containing a metal element and carbon, such as trimethylaluminum ($Al(CH_3)_3$, abbreviation: TMA) gas or the like. The same gas as in the above-described embodiments may be used as the reaction gas.

For example, a TiON film or a TiO film may be formed on the wafer 200 by the film forming sequences described below.

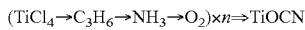

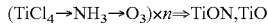

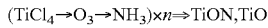

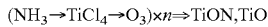

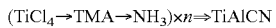

That is to say, the present disclosure may be suitably applied to the case of forming a film containing a predetermined element such as a metalloid element or a metal element. Even in the case where this film formation is performed, the film formation may be performed under the same processing conditions as in the above-described embodiments, and the same effects as in the above-described embodiments may be obtained.

Recipes (programs describing processing procedures and processing conditions) used in substrate processing may be prepared individually according to the processing contents (the kind, composition ratio, quality, film thickness, processing procedure and processing condition of the film as formed) and may be stored in the memory device 121c via a telecommunication line or the external memory device 123. Moreover, at the beginning of processing, the CPU 121a may properly select an appropriate recipe from the recipes stored in the memory device 121c according to the processing contents. Thus, it is possible for one substrate processing apparatus to form films of different kinds, composition ratios, qualities and thicknesses with enhanced reproducibility. In addition, it is possible to reduce an operator's burden (e.g., a burden borne by an operator when inputting processing procedures and processing conditions) and to quickly start the substrate processing while avoiding an operation error.

The process recipes mentioned above are not limited to newly-prepared ones but may be prepared, for example, by modifying existing recipes that are already installed in the substrate processing apparatus. Once the recipes are modified, the modified recipes may be installed in the substrate processing apparatus via a telecommunication line or a recording medium storing the recipes. In addition, the existing recipes already installed in the substrate processing apparatus may be directly modified by operating the input/output device 122 of the existing substrate processing apparatus.

In addition, the above-described embodiments and modifications may be used in combination as appropriate. In addition, the processing conditions in this operation may be, for example, the same as the processing conditions of the above-described embodiments and modifications.

According to the present disclosure in some embodiments, it is possible to suppress generation of particles when a film is formed on a substrate.

While certain embodiments have been described, these embodiments have been presented as examples only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:
    forming a film on a substrate in a process chamber by performing:
        supplying a precursor gas to the substrate through a first nozzle; and
        supplying at least one selected from a group consisting of an oxygen-containing gas and a nitrogen-and-hydrogen-containing gas to the substrate through a second nozzle that is configured such that gas stagnation on a surface of the second nozzle caused by the second nozzle is less than gas stagnation on a surface of the first nozzle caused by the first nozzle, or such that contact of the second nozzle with gas staying on the surface of the second nozzle is less than contact of the first nozzle with gas staying on the surface of the first nozzle.

2. The method according to claim 1, wherein the second nozzle includes a hollow tubular portion and at least one gas supply hole installed at a side periphery of the tubular portion, and
    wherein a diameter of the at least one gas supply hole increases from a radial inner side to a radial outer side of the tubular portion.

3. The method according to claim 2, wherein the at least one gas supply hole includes a plurality of gas supply holes arranged along a longitudinal direction of the tubular portion, and
    wherein a predetermined gas supply hole among the plurality of gas supply holes and a gas supply hole adjacent to the predetermined gas supply hole among the plurality of gas supply holes are connected to each other without a gap, or overlap with each other on a side peripheral surface of the tubular portion.

4. The method according to claim 1, wherein the second nozzle includes a hollow tubular portion and at least one gas supply hole installed at a side periphery of the tubular portion, and
    wherein a region of a side peripheral surface of the tubular portion, which configures the at least one gas supply hole, forms a protrusion portion by protruding outward from a radial inner side to a radial outer side of the tubular portion more than other regions of the tubular portion.

5. The method according to claim 4, wherein a region around the protrusion portion on the side peripheral surface of the tubular portion is flat.

6. The method according to claim 4, wherein the protrusion portion is formed by cutting a part of the tubular portion.

7. The method according to claim 4, wherein the protrusion portion is formed by cutting a periphery of a part of the tubular portion while leaving the part of the tubular portion.

8. The method according to claim 1, wherein each of the first nozzle and the second nozzle includes a hollow tubular portion and at least one gas supply hole installed at a side periphery of the tubular portion, and
    wherein an outer diameter of the tubular portion of the second nozzle is smaller than an outer diameter of the tubular portion of the first nozzle.

9. The method according to claim 8, wherein a cross-sectional shape of the tubular portion of the second nozzle is an ellipse, and
   wherein at least one gas supply hole installed at the tubular portion of the second nozzle is configured to inject gas along a major axis direction of the ellipse.

10. The method according to claim 1, wherein the second nozzle includes a hollow tubular portion and at least one gas supply hole formed by laser-processing a side periphery of the tubular portion.

11. The method according to claim 1, wherein the act of forming the film on the substrate includes performing a cycle a predetermined number of times, the cycle including non-simultaneously performing:
   supplying the precursor gas to the substrate;
   supplying the oxygen-containing gas to the substrate; and
   supplying the nitrogen-and-hydrogen-containing gas to the substrate.

12. The method according to claim 1, wherein the act of forming the film on the substrate includes performing a cycle a predetermined number of times, the cycle including non-simultaneously performing:
   supplying the precursor gas to the substrate;
   supplying a carbon-containing gas to the substrate;
   supplying the oxygen-containing gas to the substrate; and
   supplying the nitrogen-and-hydrogen-containing gas to the substrate.

13. The method according to claim 11, wherein the act of supplying the oxygen-containing gas to the substrate and the act of supplying the nitrogen-and-hydrogen-containing gas to the substrate are performed using the same nozzle.

14. The method according to claim 11, wherein the act of supplying the oxygen-containing gas to the substrate and the act of supplying the nitrogen-and-hydrogen-containing gas to the substrate are performed using different nozzles.

15. A substrate processing apparatus, comprising:
   a process chamber configured to accommodate a substrate;
   a first supply system configured to supply a precursor gas into the process chamber through a first nozzle;
   a second supply system configured to supply at least one selected from a group consisting of an oxygen-containing gas and a nitrogen-and-hydrogen-containing gas into the process chamber through a second nozzle that is configured such that gas stagnation on a surface of the second nozzle caused by the second nozzle is less than gas stagnation on a surface of the first nozzle caused by the first nozzle, or such that contact of the second nozzle with gas staying on the surface of the second nozzle is less than contact of the first nozzle with gas staying on the surface of the first nozzle; and
   a controller configured to control the first supply system and the second supply system to:
      form a film on the substrate in the process chamber by performing:
         supplying the precursor gas to the substrate; and
         supplying the at least one selected from the group consisting of the oxygen-containing gas and the nitrogen-and-hydrogen-containing gas to the substrate.

16. A non-transitory computer-readable recording medium storing a program that causes a computer to perform a process of:
   forming a film on a substrate in a process chamber by performing:
      supplying a precursor gas to the substrate through a first nozzle; and
      supplying at least one selected from a group consisting of an oxygen-containing gas and a nitrogen-and-hydrogen-containing gas to the substrate through a second nozzle that is configured such that gas stagnation on a surface of the second nozzle caused by the second nozzle is less than gas stagnation on a surface of the first nozzle caused by the first nozzle, or such that contact of the second nozzle with gas staying on the surface of the second nozzle is less than contact of the first nozzle with gas staying on the surface of the first nozzle.

* * * * *